(12) United States Patent
Guimbretiere et al.

(10) Patent No.: US 11,179,884 B2
(45) Date of Patent: Nov. 23, 2021

(54) METHODS FOR INCREMENTAL 3D PRINTING AND 3D PRINTING ARBITRARY WIREFRAME MESHES

(71) Applicant: Cornell University, Ithaca, NY (US)

(72) Inventors: Francois Guimbretiere, Ithaca, NY (US); Huaishu Peng, Ithaca, NY (US); Stephen Robert Marschner, Ithaca, NY (US); Rundong Wu, Ithaca, NY (US)

(73) Assignee: Cornell University, Ithaca, NY (US)

( * ) Notice: Subject to any disclaimer, the term of this patent is extended or adjusted under 35 U.S.C. 154(b) by 31 days.

(21) Appl. No.: 16/093,885

(22) PCT Filed: Apr. 14, 2017

(86) PCT No.: PCT/US2017/027816
§ 371 (c)(1),
(2) Date: Oct. 15, 2018

(87) PCT Pub. No.: WO2017/181151
PCT Pub. Date: Oct. 19, 2017

(65) Prior Publication Data
US 2019/0084224 A1  Mar. 21, 2019

Related U.S. Application Data

(60) Provisional application No. 62/322,788, filed on Apr. 14, 2016.

(51) Int. Cl.
*G05B 15/02* (2006.01)
*B29C 64/141* (2017.01)
*G06T 17/20* (2006.01)
*B33Y 10/00* (2015.01)
*B33Y 30/00* (2015.01)
*B33Y 50/02* (2015.01)
(Continued)

(52) U.S. Cl.
CPC .......... *B29C 64/141* (2017.08); *B29C 64/118* (2017.08); *B29C 64/314* (2017.08); *B29C 64/321* (2017.08); *B29C 64/393* (2017.08); *B33Y 10/00* (2014.12); *B33Y 30/00* (2014.12); *B33Y 50/02* (2014.12); *G05B 15/02* (2013.01); *G06F 30/17* (2020.01); *G06T 17/20* (2013.01)

(58) Field of Classification Search
None
See application file for complete search history.

(56) References Cited

U.S. PATENT DOCUMENTS

2009/0190858 A1* 7/2009 Moody ................... G06T 11/60
382/276
2009/0303507 A1 12/2009 Abeloe
(Continued)

FOREIGN PATENT DOCUMENTS

WO  2016/040507 A1  3/2016

*Primary Examiner* — Jason Lin
(74) *Attorney, Agent, or Firm* — Hodgson Russ LLP

(57) ABSTRACT

Systems and methods are provided for incremental 3D printing, wherein wireframes are generated and printed (scheduled for print) during the design process. In another aspect, systems and methods are provided for printing arbitrary meshes. A 3D printer system is described having, for example, five degree-of-freedom (5DOF). The 5DOF printer may be used to perform any of the methods described herein and combinations of the methods.

20 Claims, 29 Drawing Sheets

(51) Int. Cl.
*B29C 64/118* (2017.01)
*G06F 30/17* (2020.01)
*B29C 64/314* (2017.01)
*B29C 64/321* (2017.01)
*B29C 64/393* (2017.01)

(56) References Cited

U.S. PATENT DOCUMENTS

| | | | |
|---|---|---|---|
| 2013/0050213 A1 | 2/2013 | McCombe et al. | |
| 2013/0293539 A1 | 11/2013 | Hunt et al. | |
| 2014/0052287 A1 | 2/2014 | Swanson et al. | |
| 2014/0301179 A1 | 10/2014 | Rich et al. | |
| 2015/0039113 A1* | 2/2015 | Kanada | B29C 64/106 |
| | | | 700/98 |
| 2015/0055086 A1* | 2/2015 | Fonte | G02C 13/003 |
| | | | 351/178 |
| 2016/0001503 A1* | 1/2016 | Tsai | B29C 67/0055 |
| | | | 264/40.7 |
| 2017/0266727 A1* | 9/2017 | Nishino | G01N 21/1702 |

* cited by examiner

METHODS FOR INCREMENTAL 3D PRINTING AND 3D PRINTING ARBITRARY WIREFRAME MESHES

CROSS-REFERENCE TO RELATED APPLICATIONS

This application claims priority to U.S. Provisional Application No. 62/322,788, filed on Apr. 14, 2016, the disclosure of which is incorporated herein by reference.

STATEMENT REGARDING FEDERALLY SPONSORED RESEARCH

This invention was made with government support under contract nos. IIS-1422106 and IIS-1011919 awarded by the National Science Foundation. The government has certain rights in the invention.

FIELD OF THE DISCLOSURE

The present disclosure relates to 3D printing, and more particularly to 3D wireframe printing.

BACKGROUND OF THE DISCLOSURE

Since the notion of interactive fabrication was introduced, several approaches have been proposed for hands-on digital fabrication. For example, previous techniques provided: step-by-step fabrication of functional objects using a laser cutter controlled by a laser pointer; the ability for non-experts to design 3D digital models from scratch using a digitally-controlled wax extruder; and merging manual shaping with digital milling and extrusion of synthetic clay. On the one hand, these interactive fabrication systems offer immediate, tangible feedback that can benefit the design process. On the other hand, they are often slow because designers have to instantiate the physical model themselves. Furthermore, CAD users might find them frustrating to use because they lack support for implicit 3D commands (such as construction of solid geometries and complex surface creation), which are difficult to implement in interactive fabrication systems.

At the same time, there has been a push to reduce the lead-time between the creation of a 3D model and its actual instantiation. For example, some previous techniques limited the use of a 3D printer to complex geometry, while a previous wireframe printer creates a low-fidelity mesh representation of the model. These approaches serve the traditional "design-fabricate-refine" workflow, which is common in digital fabrication, and each is directed to printing completed models.

There is a long-felt need for a 3D printer and method that can accommodate an interactive fabrication workflow.

Affordable 3D printers make it easy for anyone to fabricate complex physical artifacts nowadays. Traditional 3D printers have 3 degrees-of-freedom (DOF)—i.e., the printhead can move to any point in space but cannot rotate. To avoid collisions between the printhead and the print, objects generally are printed layer by layer. This means overhangs must be printed after building some supporting structures, and some surface features are hard to produce by only printing from straight above. Recently, 3D printers for printing wireframe meshes have been proposed. Such printers print wireframes by extruding or otherwise depositing filament directly in 3D space, creating each edge in a single stroke rather than layer by layer. Compared with traditional 3D printed objects, 3D wire meshes are faster to print and are a good aid to surface depiction, where the inner structure of models can be seen and surface features such as curvature can be indicated by the arrangement of edges.

The concept of directly printing mesh edges in 3D space was previously introduced in a wireframe printer, which proposed to print wire meshes to give designers a fast preview of 3D models. The models were sliced with many horizontal planes and wireframe representations were fabricated by alternately printing the planar slices and a fixed zigzag pattern between the slices. This previous wireframe printer was a 3DOF printer, so the edges could only be printed by a printhead from above, and the printer could not print any edge steeper than a certain threshold downward. This constraint was considered when generating the zigzags, leaving out one edge in each slice to avoid collision. These limitations of 3DOF printing led printing only horizontally sliced wire frames, a constraint which seriously affects the mesh quality.

Accordingly, there is a need for a method for printing arbitrary wireframes that are not constrained by generation via horizontal slicing.

BRIEF SUMMARY OF THE DISCLOSURE

An aspect of the present disclosure describes On-the-Fly Print, a system which bridges the gap between hands-on interactive fabrication and purely digital modeling practice. To do so, On-the-Fly Print may create low-fidelity physical "sketches" in parallel with the creation of the corresponding digital model. Throughout the 3D modeling process, the user can hold the physical print in hand to gather tangible feedback and evaluate its fit with external constraints. On-the-Fly Print grants CAD users continuous access to a low-fidelity representation of their design. This approach has the potential to improve the overall quality of the design process.

To improve flexibility, an exemplary 5DOF printer is disclosed, which modifies a standard delta 3D printer by adding two rotation axes. Using a 5DOF printer, the edges of a printed object can effectively be approached from any direction in the hemisphere.

In another aspect, the present disclosure describes a process for generating printing plans for wireframe printers given arbitrary input meshes. The presently disclosed collision avoidance process finds a locally minimal set of constraints on the order of edges. By following this set of constraints, the mesh can be printed without collision. The process may constrain the ordering as little as possible to leave freedom to order the edges in the next phase.

The present disclosure provides a method for incrementally printing a 3D object as a set of wireframes, including determining if a primitive is complete, determining if the primitive contacts an origin or a scheduled primitive, generating a wireframe of the primitive if the primitive is complete and if the primitive contacts the origin or a scheduled primitive, and printing the wireframe of the primitive using a 3D printer, the wireframe comprising a plurality of segments. In a further embodiment of the present disclosure, the primitive is determined to be complete if the primitive has not been modified for a pre-determined period of time.

A further embodiment of the present disclosure may additionally include determining if at least one segment of the generated wireframe will contact a wireframe of a scheduled primitive (a "scheduled wireframe"), defining a connecting patch of the scheduled wireframe, such that the connecting patch will connect one or more segments of the generated wireframe to the scheduled wireframe, and scheduling the connecting patch for printing on the 3D printer.

A further embodiment of the present disclosure may additionally include determining if the generated wireframe includes an overhang, defining a support component extending from a scheduled wireframe to a bottom contour of the overhang, and scheduling the support component for printing on the 3D printer.

A further embodiment of the present disclosure may additionally include adding the wireframe to a queue of scheduled operations for the 3D printer, calculating a set of possible sequences for the queue of scheduled operations and a number of conflicts for each sequence, and ordering the scheduled operations according to a sequence selected from the set of possible sequences, the selected sequence having the lowest number of conflicts.

The present disclosure may be additionally embodied as a method for cutting with a 3D printer comprising a cutting tool, the method including determining if a subtractive primitive is complete, defining a cutting tool path at the intersection of the completed subtractive primitive and a scheduled primitive, and scheduling a cutting operation along the cutting tool path with the 3D printer. A further embodiment of the present disclosure may additionally include comprising generating one or more healing segments along the cutting tool path and scheduling the healing segments to be printed.

A further embodiment of the present disclosure may additionally include determining if the cutting tool path will intersect a scheduled wireframe, defining a sacrificial patch of the scheduled wireframe, if the cutting tool will not intersect the scheduled wireframe, wherein the sacrificial patch will intersect the cutting tool path, scheduling the sacrificial patch for printing on the 3D printer.

The present disclosure may be additionally embodied as a system for incremental 3D printing, the system including a printhead operable to deposit a filament of print medium, a base on which the print medium is deposited, one or more actuators for moving the printhead and/or the base relative to one another, a processor in communication with the one or more actuators and the printhead. The processor may be programmed to determine whether a primitive is complete, determine whether the primitive contacts an origin or a scheduled primitive, generate a wireframe of the primitive if the primitive is complete and if the primitive contacts the origin or a scheduled primitive, and operate the printhead and the one or more actuators to print the wireframe of the primitive. In a further embodiment of the present disclosure the relative movement between the printhead and the base includes at least five degrees-of-freedom. In a further embodiment of the present disclosure the degrees-of-freedom include translation and rotation.

In a further embodiment of the present disclosure the printhead further includes a cutting tool and the processor is further programmed to determine if a subtractive primitive is complete, define a cutting tool path at the intersection of the completed subtractive primitive and a printed primitive, and move the cutting tool along the defined cutting tool path. In a further embodiment of the present disclosure the cutting tool is a heated blade.

In a further embodiment of the present disclosure the platform is removable and the processor is programmed to pause printing operations for removal of the platform. In a further embodiment of the present disclosure the platform comprises one or more alignment components for aligning the platform during reinstallation. In a further embodiment of the present disclosure one or more alignment components are magnets, pins, tabs, and/or notches.

A further embodiment of the present disclosure may additionally include a cooling device for cooling deposited print medium. In a further embodiment of the present disclosure the cooling device is a mist head for cooling deposited print medium.

The present disclosure may be additionally embodied as a method for scheduling operations of a 3D printer, including calculating a set of possible sequences for a queue of scheduled operations and a number of conflicts for each sequence, and ordering the scheduled operations according to a sequence selected from the set of possible sequences, the selected sequence having the lowest number of conflicts.

The present disclosure may be additionally embodied as a method for 3D printing a wireframe, the method including receiving a model to be printed, the model comprising a plurality of edges, peeling the model to generate a set of constraints for an edge print schedule that ensure collision-free printing orientations will exist for every edge, reducing the set of constraints by removing redundant constraints, generating the edge print schedule based on the reduced set of constraints, and printing the wireframe according to the edge print schedule.

In a further embodiment of the present disclosure peeling the model comprises identifying, as an open edge in a layer of the model, each edge that can be printed in at least one orientation of a printhead of a 3D printer and wherein the printhead would not collide with another edge, repeating the identifying step for additional layers of the model until no open edges remain, wherein collisions with open edges of previous layers are ignored for each iteration, and generating the set of constraints according to the identified open edges for the layers. A further embodiment of the present disclosure may additionally include labeling each edge with a distance of such edge from an origin and prioritizing identifying open edges based on distance from the origin. In a further embodiment of the present disclosure reducing the set of constraints includes removing each outgoing constraint of each edge of the model where removal would not result in the edge becoming closed. In a further embodiment of the present disclosure generating the edge print schedule comprises determining an initial edge print schedule based on the reduced set of constraints, and grouping contiguous edges of the print schedule into strips.

The present disclosure may be additionally embodied as a system 3D printing arbitrary meshes, the system comprising a printhead operable to extrude a print medium, a platform on which the print medium is deposited, and one or more actuators for moving the printhead and/or the platform relative to one another, and a processor in communication with the one or more actuators and the printhead. The processor may be programmed to receive a model to be printed, the model comprising a plurality of edges, peel the model to generate a set of constraints for an edge print schedule that ensure collision-free printing orientations will exist for every edge, reduce the set of constraints by removing redundant constraints, generate the edge print schedule based on the reduced set of constraints, and operate the printhead and the one or more actuators to print the wireframe according to the edge print schedule.

In a further embodiment of the present disclosure the processor is programmed to peel the model to generate a set of constraints by identifying, as an open edge in a layer of the model, each edge that can be printed in each orientation of a printhead of a 3D printer and wherein the printhead would not collide with another edge, repeating the identifying step for additional layers of the model until all no open edges remain, wherein collisions with open edges of previous layers are ignored for each iteration, and generating the set of constraints according to the identified open edges for the layers.

DESCRIPTION OF THE DRAWINGS

For a fuller understanding of the nature and objects of the disclosure, reference should be made to the following detailed description taken in conjunction with the accompanying drawings, in which:

FIGS. 7A-7D show a wireframe object (FIG. 7D) which will not commence printing unless the digital model (primitive) contacts the origin (e.g., a printer base), wherein FIGS. 7A-7B show the unprintable digital model shaded and FIG. 7C shows the printable digital model intersecting the base;

DETAILED DESCRIPTION OF THE DISCLOSURE

Incremental 3D Printing

Figure 1A:
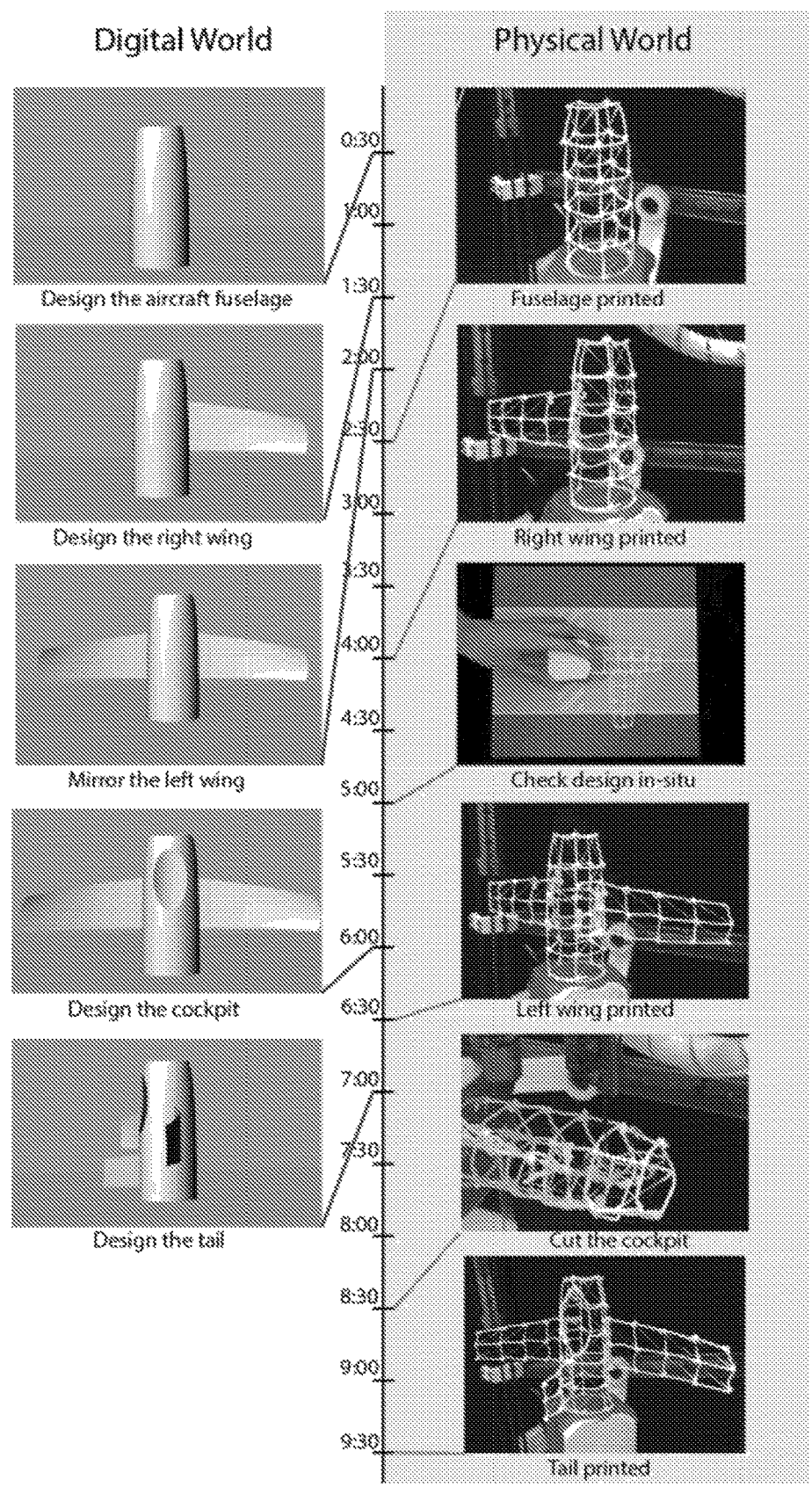
FIG. 1A depicts a timeline showing a wireframe prototype of an airplane being fabricated using an incremental print method according to an embodiment of the present disclosure, wherein the timeline shows printing and cutting operations and the users checking the fit of the design at the five minute mark.
Figure 1B:
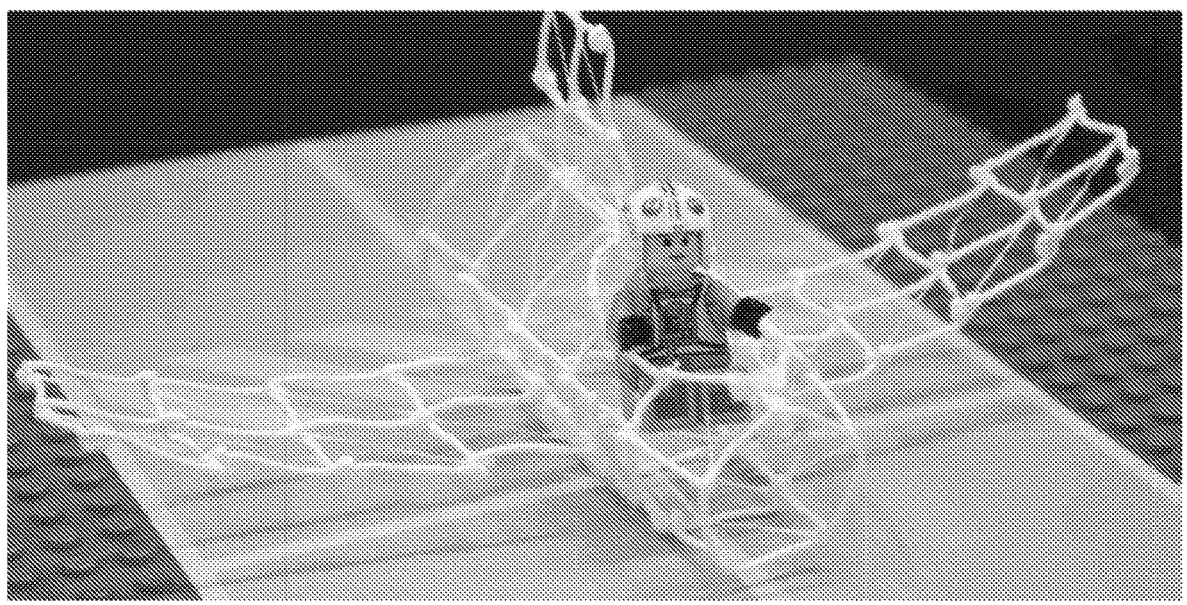
FIG. 1B shows the end result of the design timeline of FIG. 1A.

In a first aspect the present disclosure provides systems and methods for incremental printing 3D objects—sometimes referred to herein as On-the-Fly printing. An objective of the On-the-Fly printing technique is to provide computer-aided design (CAD) users with a tangible preview of their digital models during the digital design process. To illustrate a typical interaction, consider the case of a user designing an aircraft model compatible with a toy airport runway set (FIGS. 1A and 1B). After measuring the size of the airport runway set, the user starts the design of the aircraft fuselage in the software. The system starts printing the fuselage automatically after the geometry is finalized. As this happens, the designer moves on to specify the right wing using a curved design. She then mirrors the first wing to create the left wing. About two minutes later, the first wing is printed and she pauses the printer to remove the model and check if the proportion of the wing matches the toy airport runway. Satisfied with the proportion of the design, she puts the model back into the printer and focuses on the design of the cockpit while the printer resumes printing. Her goal is to fit a figurine of the runway set inside the model. She creates cutting geometry to open a hole in the fuselage, and finally adds a tail. Within three minutes of her last addition, she has a finished model in her hand (FIG. 1B), which has already been evaluated in-situ at key design steps. This ability to quickly check a design against its intended pattern of use significantly enhances the quality of the final design.

The workflow illustrated above may be implemented using a fast incremental wireframe printer, together with a Rhino plugin that generates the proper printing instructions for each new feature (embodied as a geometric primitive). The exemplary plugin also may control the order in which each feature is executed to limit possible conflicts during the printing process.

Figure 18:
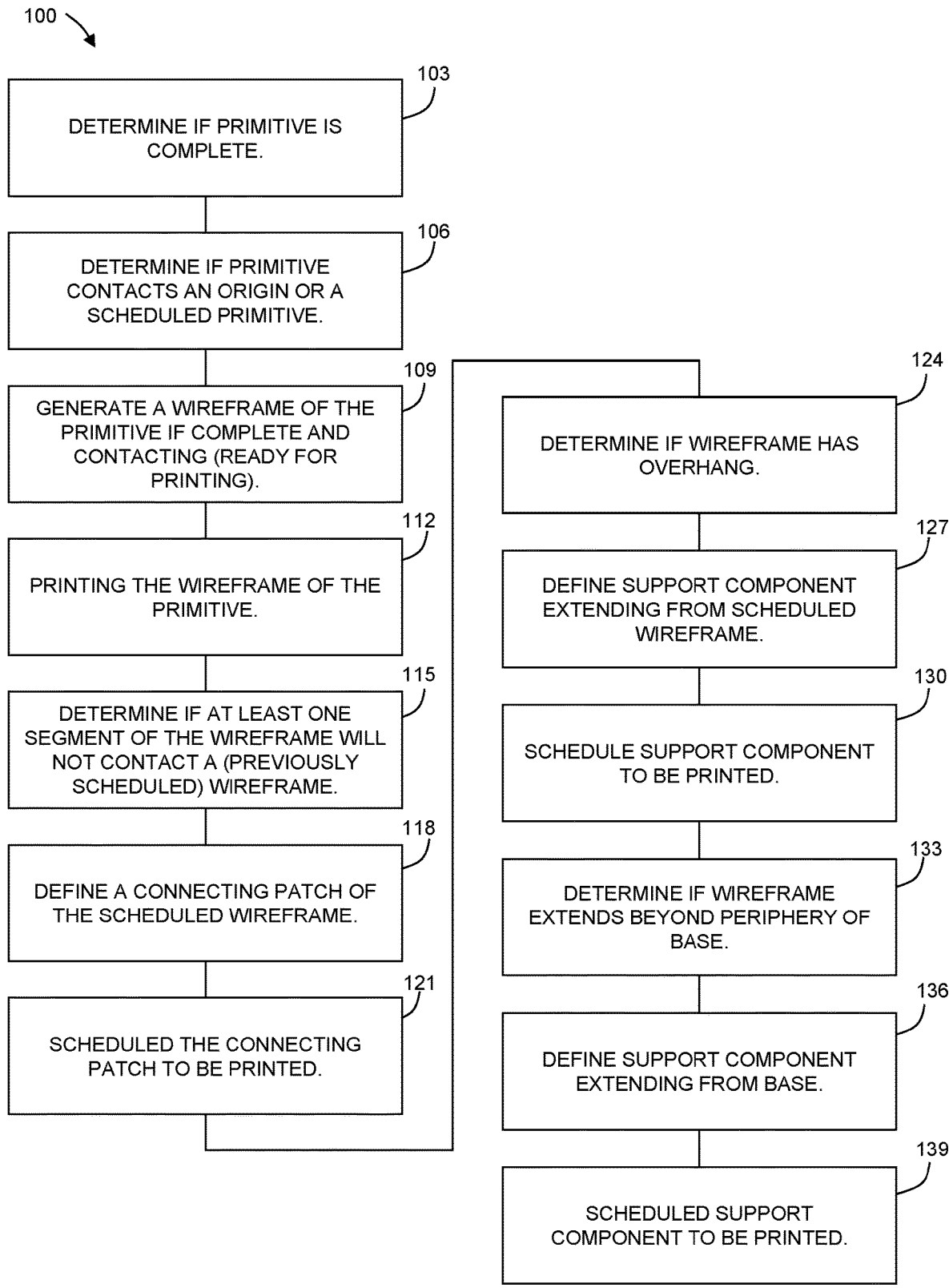
FIG. 18 is a chart showing printing a wireframe of a primitive according to an embodiment of the present disclosure.

With reference to FIG. 18, an embodiment of the present disclosure provides a method 100 for incrementally printing a 3D object as a series wireframes. The method 100 may be implemented as, for example, a software tool which monitors the creation of geometry (in the form of "primitives") by a user. The method comprises determining 103 if a primitive is complete. For example, the primitive may be determined 103 to be complete if the primitive has not been modified by the user for at least a predetermined period of time. In a more particular example, the method 100 may determine 103 that a primitive is complete if it has not been modified for a period of time greater than or equal to five second. The predetermined period of time may be selected to be any value according to the application. For example, the period of time may be 5, 6, 7, 8, 9, or 10 seconds, or any times less than, greater than, or in between these exemplary times. Other techniques for determining if a primitive is complete may be used, such as, for example, determining whether the user has identified the primitive as complete.

Figure 7A:
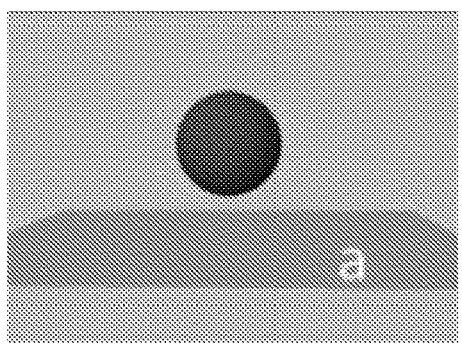
Figure 7B:
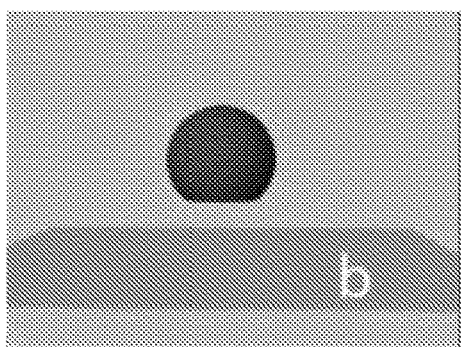
Figure 7C:
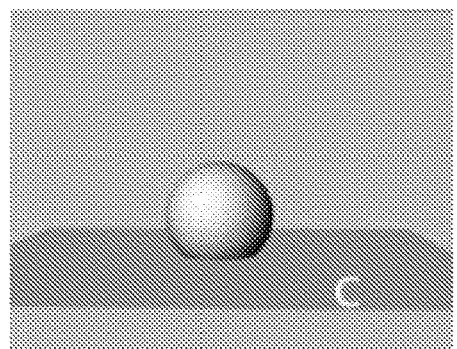
Figure 7D:
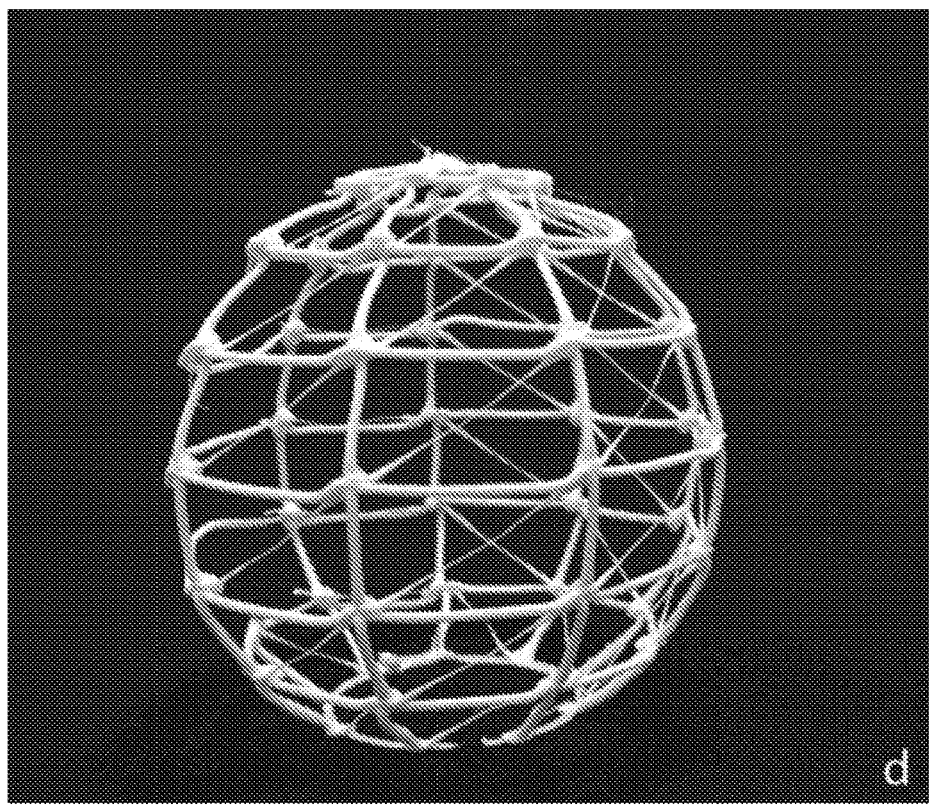

The method 100 further includes determining 106 if the primitive contacts an origin or a scheduled primitive. The origin corresponds to, for example, the base of a 3D printer, wherein the base of a 3D printer is the component onto which print medium is deposited to fabricate an object (in some embodiments, it may be a stage or a platform). A scheduled primitive is a primitive which has previously been scheduled for printing on the 3D printer. By determining 106 if the primitive contacts the origin or a scheduled primitive, a primitive will not be scheduled for printing if the resulting wireframe would not be moored to another object (e.g., the base of the printer or another printed object). For example, in FIGS. 7A-7C, it is only when the sphere is truncated and made to intersect with the building plane that printing may begin resulting in the wireframe shown in FIG. 7D.

If the primitive is ready for printing—i.e., the primitive is complete and contacts an origin or a scheduled primitive—a wireframe of the primitive is generated 109. The wireframe mesh is made up of a plurality of segments and may be generated using known techniques. For example, the UV mapping associated with the surface of the primitive may be used to generate a regular mesh. More particularly, in an exemplary embodiment using the Rhino plugin, the present method may be implemented by first calling the Surface.IsoCurve( ) function to create a reference V contour. Equally-spaced points may then be sampled along this V contour to generate all U contours for printing. The method then selects one U contour as the reference to create all V contours for printing.

Figure 8A:
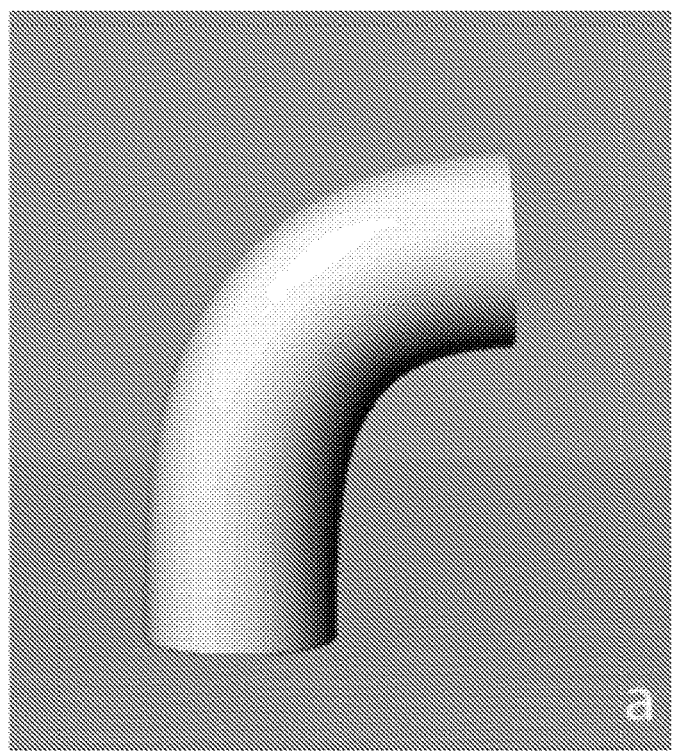
FIG. 8A depicts a digital primitive (model) of a tube.
Figure 8B:
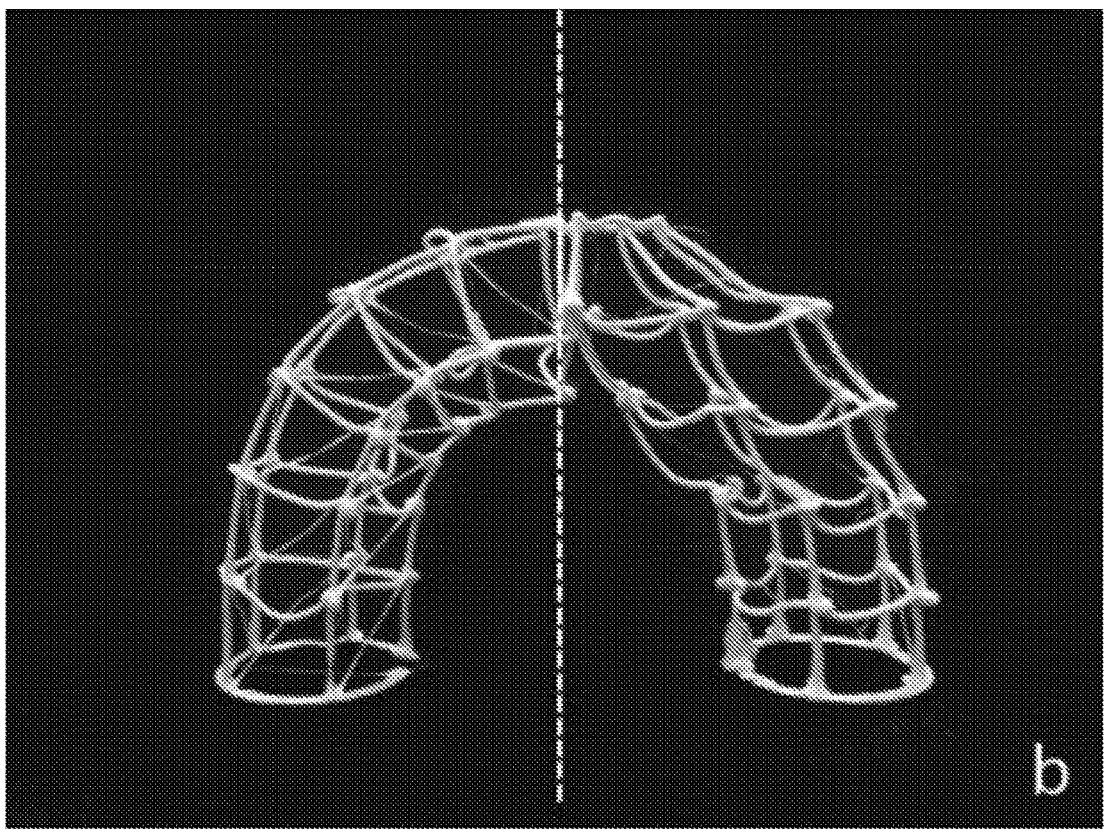
FIG. 8B shows the wireframe representations of the primitive of FIG. 8A based on UV mapping (left) and traditional parallel slicing (right)

In another example, parallel slicing may be used to generate the wireframe. FIG. 8B, shows a wireframe of a tube printed using UV coordinates (left) compared a wireframe of the tube printed using traditional parallel slicing (right). It can be seen that, in this case, the use of UV coordinates better conveys the structure of the shape when printed in large cells. As UV mapping may lead to non-parallel slicing, a suitable 3D printer may be capable of rotating the model such that filaments may be deposited upwards. The generated 109 mesh may be embodied, for example, as "G-code" for instructing the 3D printer. The method includes printing 112 the wireframe of the primitive using the 3D printer. The wireframe may be scheduled such that the printer prints the wireframe when the printer has completed any previously-scheduled tasks (e.g., printing one or more wireframes).

Creating Connecting Patches

Figure 9A:
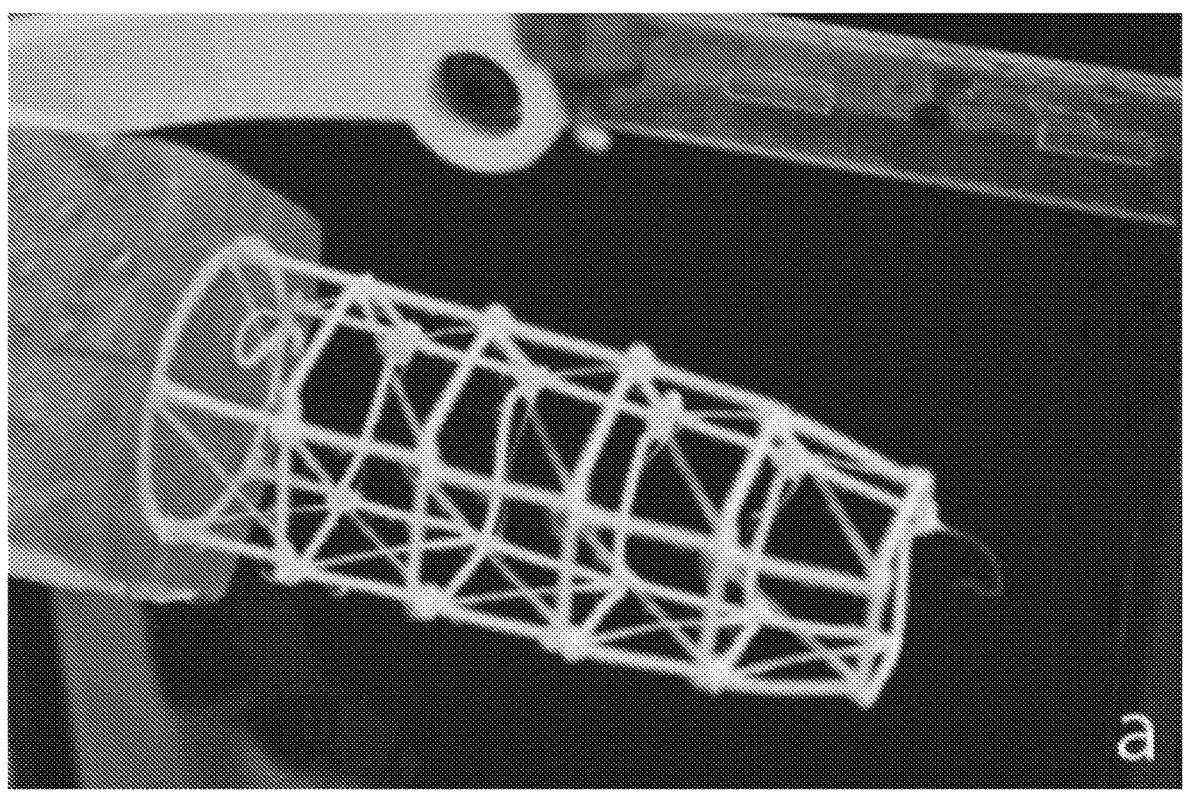
FIGS. 9A and 9B show the printing of a connecting patch for a wing of the airplane of FIG. 1B.
Figure 9B:
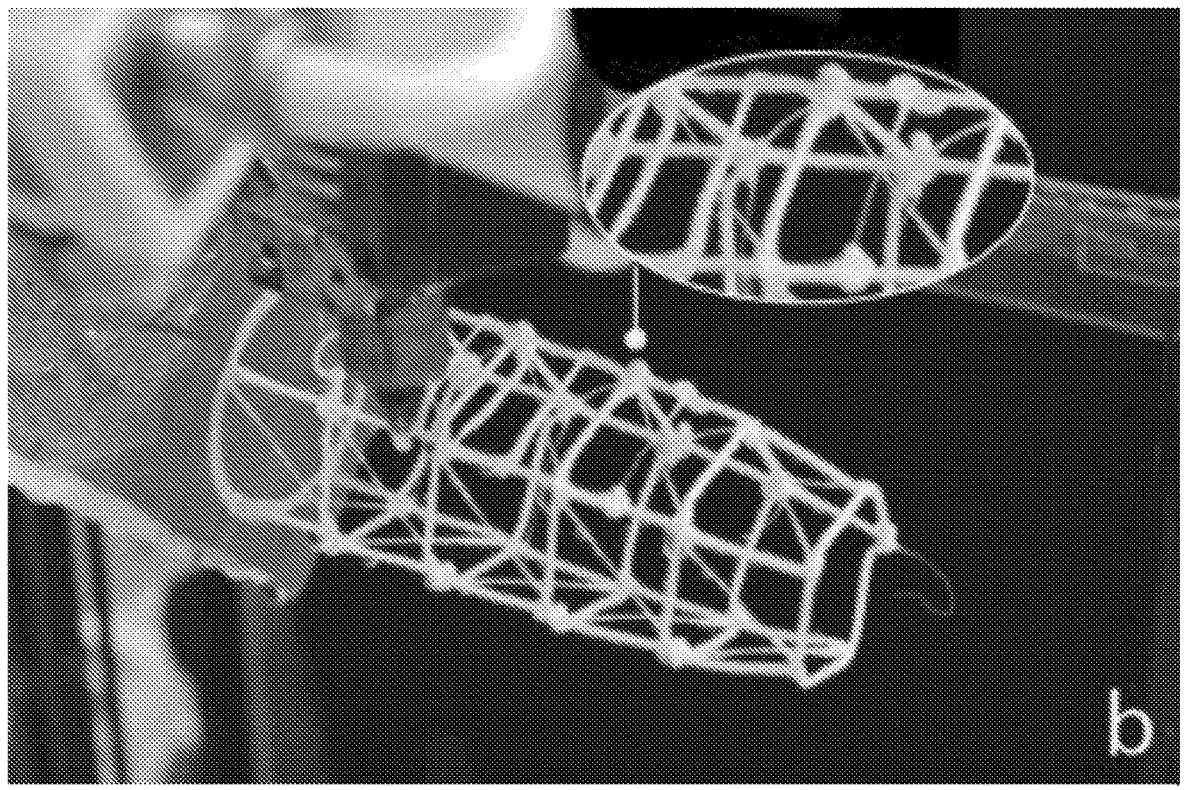

Printing wireframes instead of printing solid surfaces increases the speed of printing and decreases the time to print. However, wireframes include gaps ("cells") in the external surface of the object represented by the wireframe. The use of large cells within the wireframes further increases the speed, but results in large gaps in the external surface. This creates a problem if a new wireframe is to be printed at the location of a gap. To resolve this, the present method may include printing connecting patches to bridge gaps where necessary. The method 100 may comprise determining 115 if one or more segments of the generated 109 wireframe will contact a wireframe of a scheduled primitive (a "scheduled wireframe"). If the wireframe is determined not to contact a scheduled wireframe, a connecting patch is defined 118. For example, the gap may be patched by generating a denser wireframe mesh (a wireframe having smaller cells) to subdivide the gap. The defined 118 connecting patch is printed 112—e.g., scheduled 112 to print on a 3D printer. Because each printed segment of such a connecting patch may rest on an established segment, printing the connecting patch is generally very fast and may not require cooling (see, for example, FIGS. 9A and 9B).

Figure 10A:
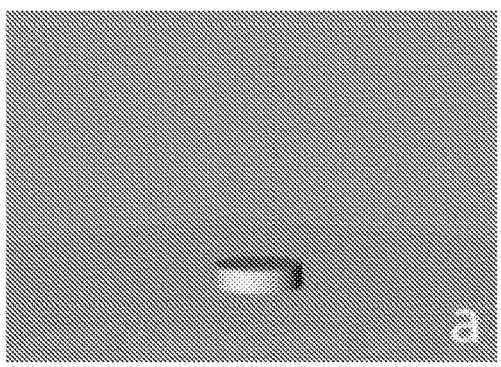
FIGS. 10A-10C depict a series of primitives used to print the lamp wireframe of FIG. 10D.
Figure 10B:
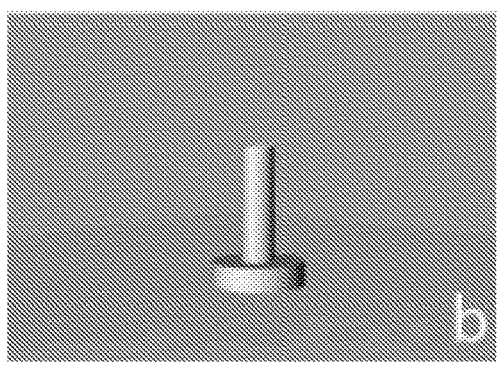
Figure 10C:
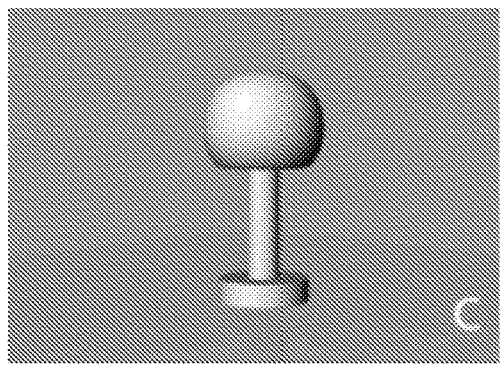
Figure 10D:
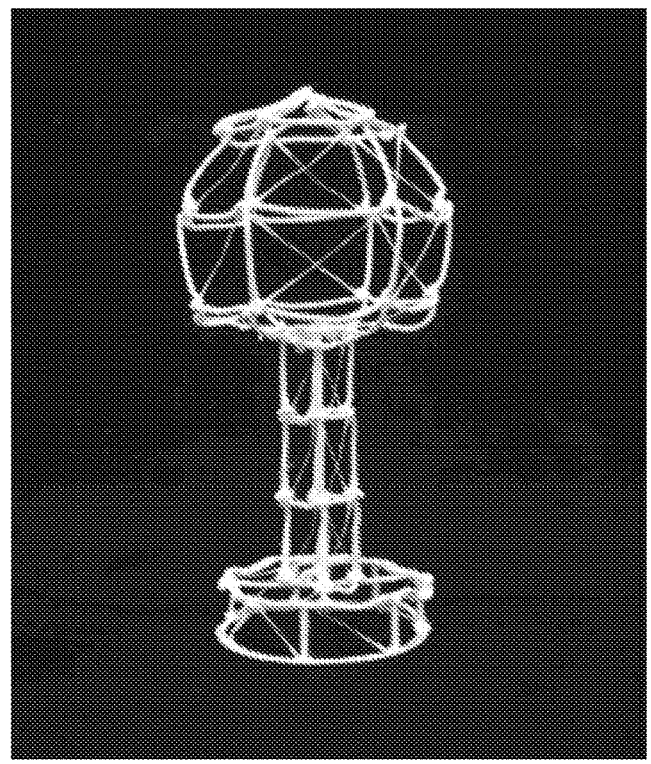

Another case wherein a patch may be desirable is where a primitive includes an overhang, such as in the model of the Jucker and Wagenfeld lamp shown in FIGS. 10A-10C. To provide support for such overhangs, support components may be printed. For example, in FIG. 10D, a support component may be printed to support the shade. As such, the method 100 may include determining 124 if the generated 109 wireframe includes an overhang. If an overhang exists, a support component is defined 127, the support component extending from a scheduled wireframe to a bottom contour of the overhang, and the support component is scheduled 130 to be printed.

Figure 14A:
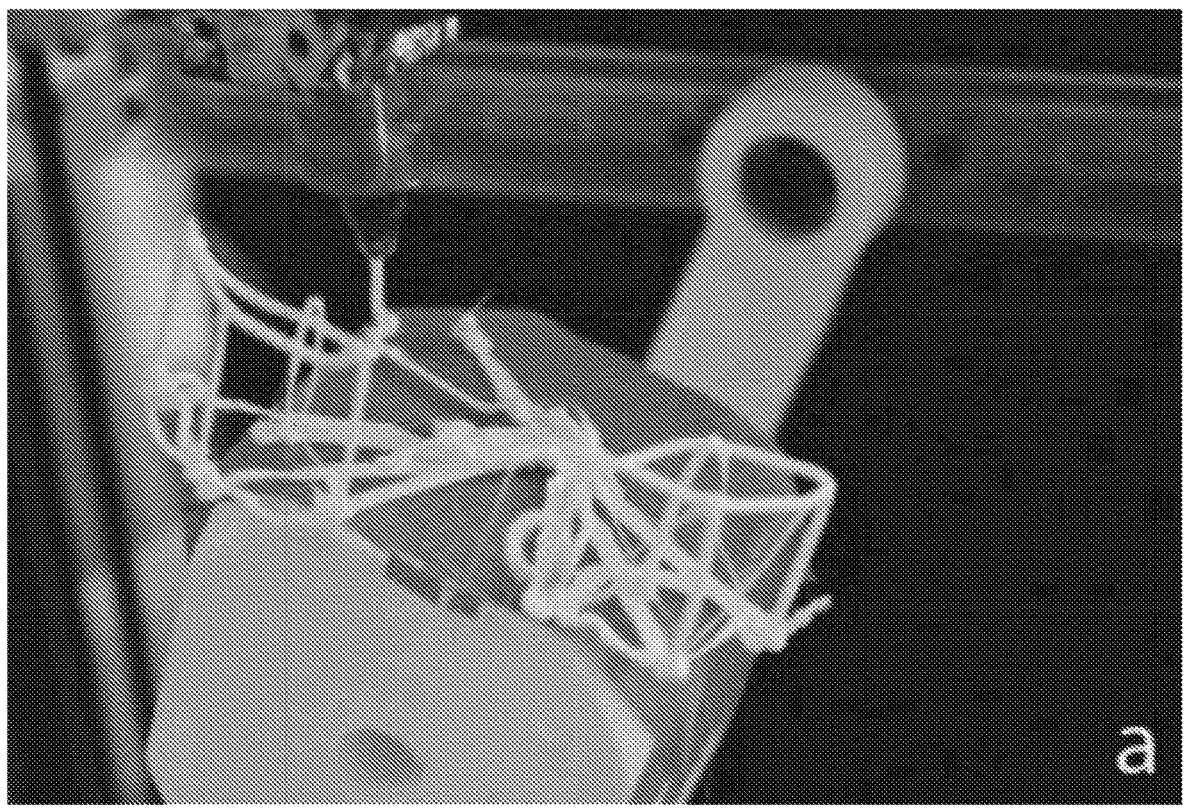
FIGS. 14A and 14B depict the printing of a set of legs for a model dinosaur at an angle to avoid collision.

A similar approach may be used when the wireframe would extend beyond the periphery of the base of the 3D printer. For example, FIG. 14A depicts an example where a wireframe dinosaur extends beyond the printer base and a support component is generated on a top surface of the base to support the wireframe. The method 100 may comprise determining 133 if the generated 109 wireframe will extend beyond a periphery of the base when printed. If the wireframe will extend beyond the base, a support component is defined 136 extending from the base, for example, a top surface of the base, to the wireframe, and the support component is scheduled 139 to be printed.

Meshes for the support components and connecting patches may defined by methods similar to those for the wireframe mesh of a primitive. For example, to patch an area, the method may determine the boundary of the area and then sub-sample the area to define the V and U lines of the patch.

Subtractive Geometry

Figure 11A:
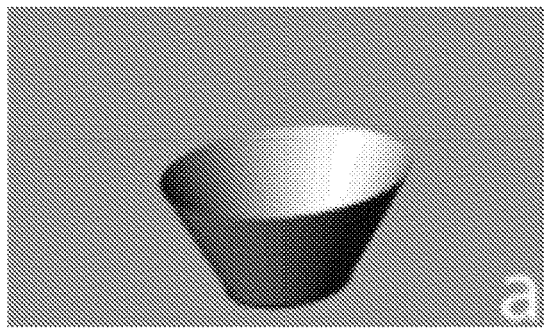
FIGS. 11A-11D depict a series of primitives used to print the Bird Nest stadium wireframe of FIG. 11E.
Figure 11B:
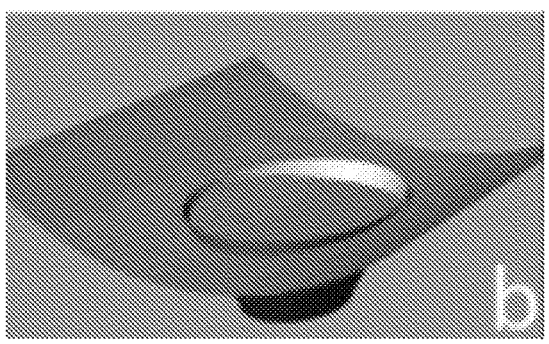
Figure 19:
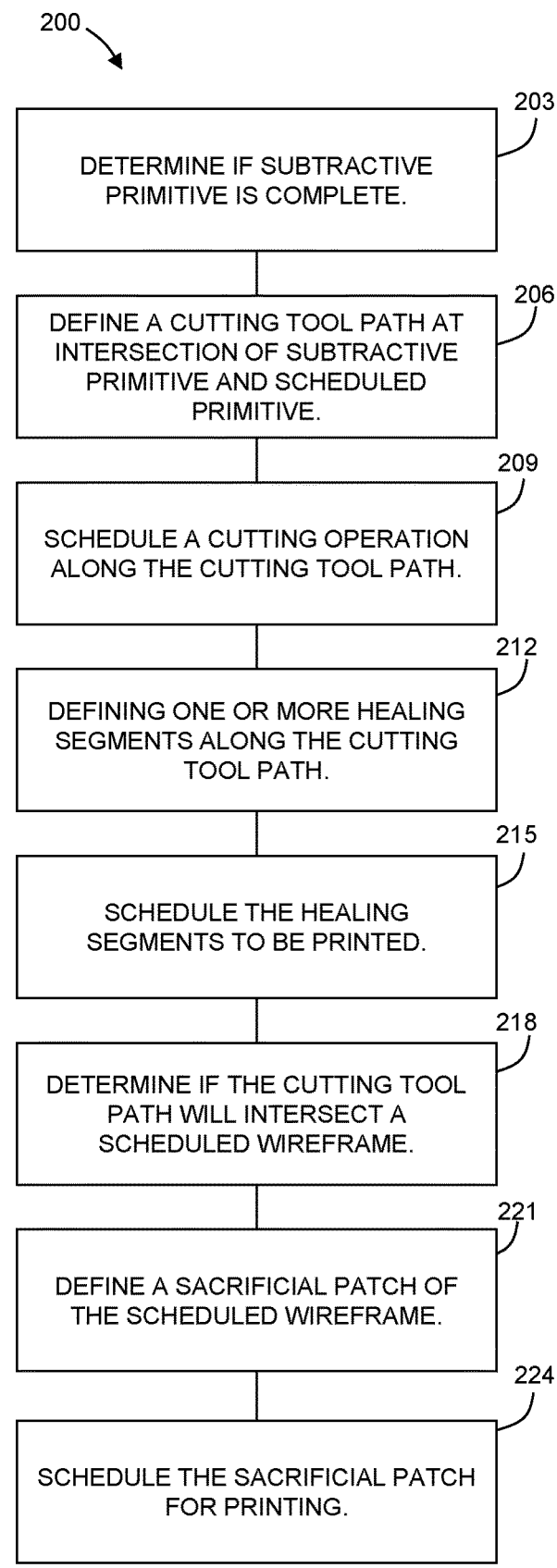
FIG. 19 is a chart showing cutting an intersection path through a previously printed wireframe according to an embodiment of the present disclosure.
Figure 20:
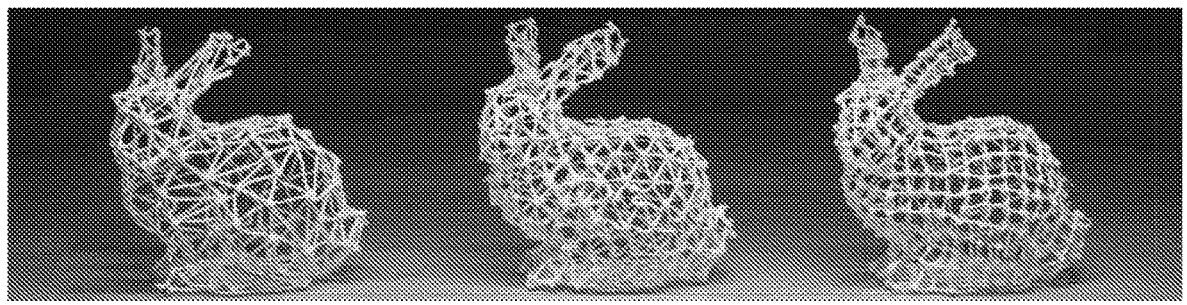
FIG. 20 is a photograph of three 3D wireframes printed from the same rabbit design, each using a different wireframe mesh.

Embodiments of the present disclosure may use subtractive surfaces to carry out cutting operations. Once the user has created a subtractive geometry (for example, the curved surface of FIG. 11B), the system computes the intersection curve between a previously-printed object and the subtractive geometry. This curve defines a path for the cutting tool (cutting tool path). The cutting tool path is then used by a 3D printer to drive a cutting tool and to remove a portion of the already-printed wireframe object. In an embodiment using a high degree-of-freedom 3D printer (for example, the system further described below), the cutting tool may be maintained in an orientation normal to the object's surface and the cut may be performed with synchronous movement in all degrees-of-freedom. With reference to FIG. 19, a method 200 for cutting with a cutting tool of a 3D printer may comprise determining 203 if a subtractive primitive is complete. Similar to above, the subtractive primitive may be considered complete in any appropriate way such as, for example, if the primitive has not been modified for at least a pre-determined period of time. A cutting tool path is defined 206 at the intersection of the completed subtractive primitive and a scheduled primitive. A cutting operation may be scheduled 209 with a 3D printer, where the cutting operation comprises driving the cutting tool along the cutting tool path (e.g., G-code instructing the 3D printer to drive the cutting tool).

Figure 11C:
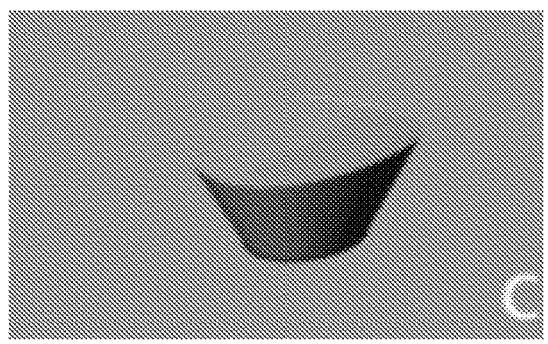
Figure 11D:
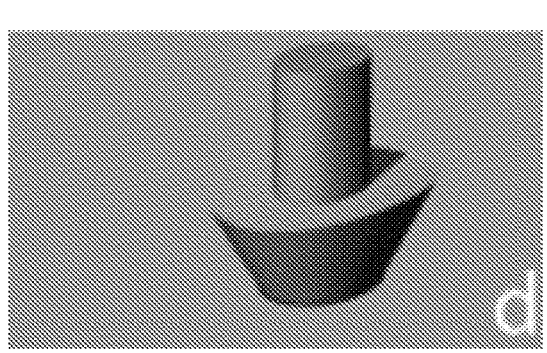
Figure 11E:
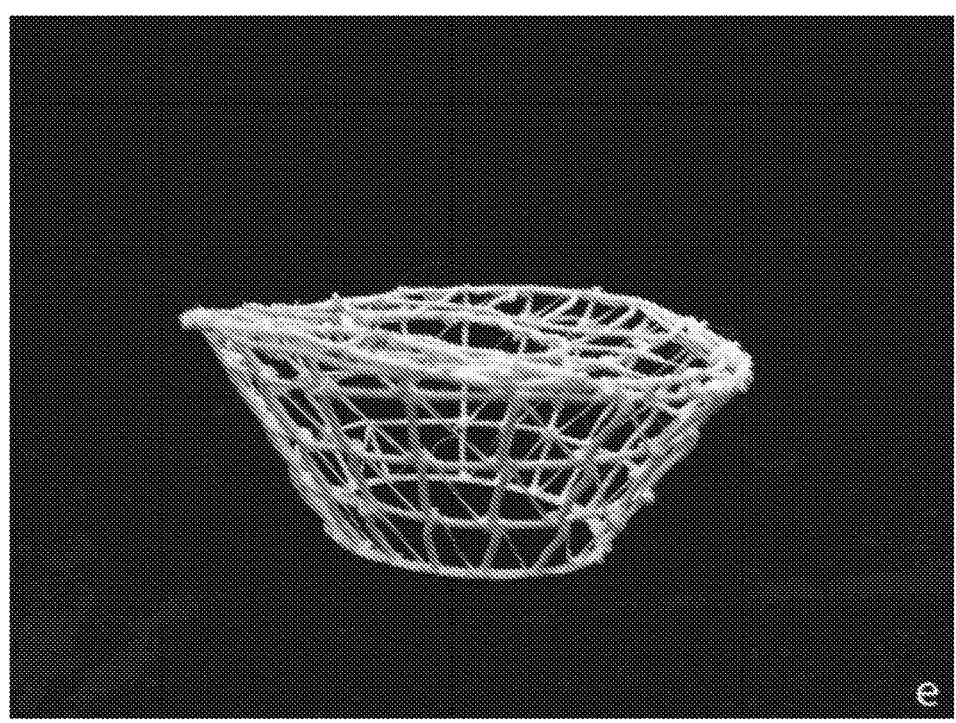

Due to the nature of wireframes, such cutting operations can leave poorly-defined geometries. For at least this reason, it may be desirable to drive the printhead along the cutting tool path to "heal" the cut by printing one or more healing segments. In some embodiments, the method 200 may further comprise defining 212 one or more healing segments along the cutting tool path and scheduling 215 the healing segments to be printed. The method 200 may further comprise generating one or more meshes necessary to close holes as required by the user. In the Bird's Nest stadium example shown in FIGS. 11A-11E, the method first drives a cutting tool to cut the tapered geometry (FIGS. 11A and 11B), and then creates a curved patch (FIG. 11C) before creating a new cut in the center (FIG. 11D).

Figure 12A:
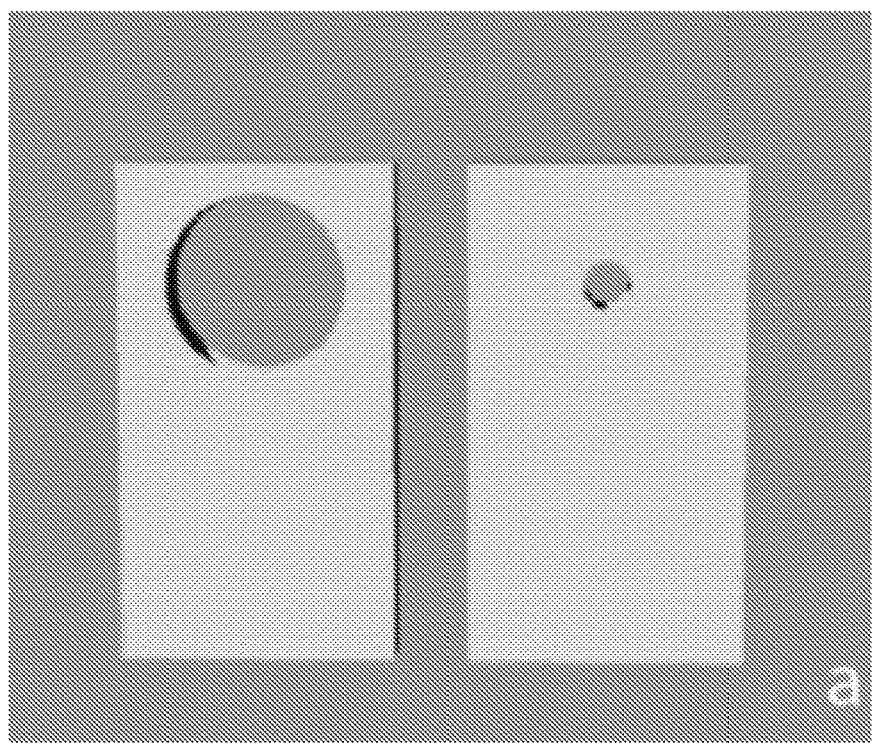
FIG. 12A depict a pair holes as subtractive primitives.
Figure 12B:
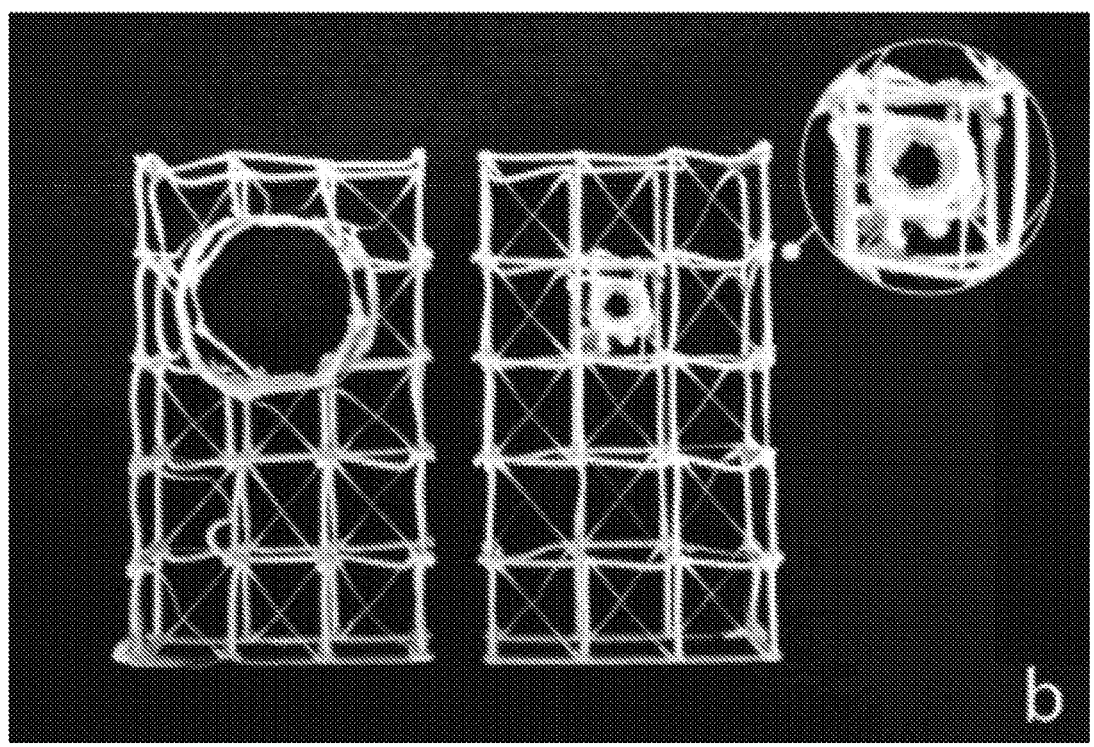
FIG. 12B shows the wireframes based on the primitives of FIG. 12A, where the wireframes were printed and the cut using the cutting tool of a printer system according to the present disclosure.
Figure 13A:
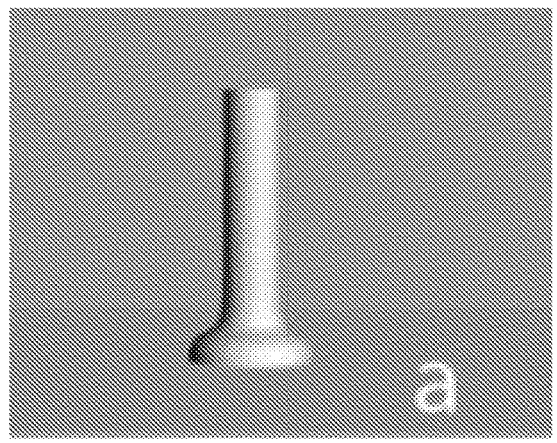
FIGS. 13A-13H depict the design of primitives for a candelabra (FIGS. 13A-13C) and the subsequent re-ordering (FIGS. 13D-13H) of the print order of the primitives to prevent the printing of the top branch from being blocked by the already-printed bottom branch.
Figure 13B:
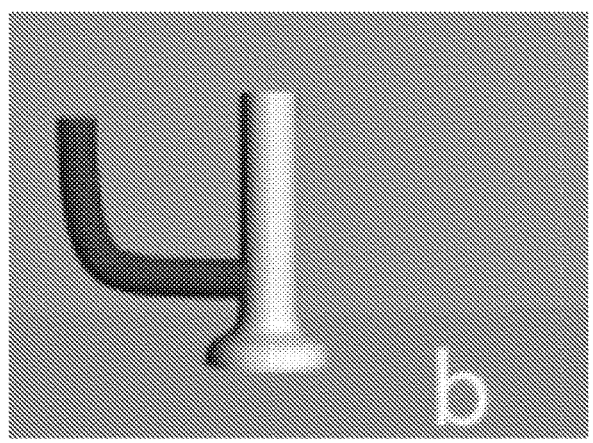
Figure 13C:
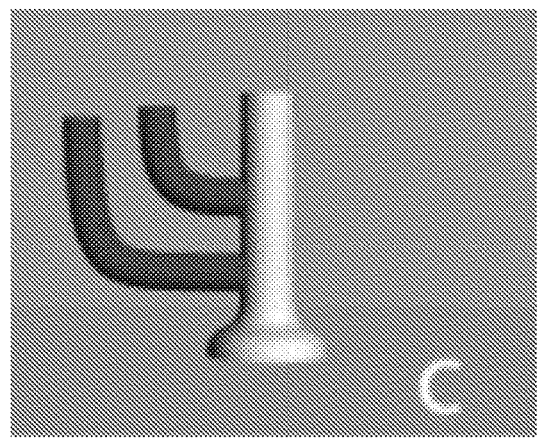
Figure 13D:
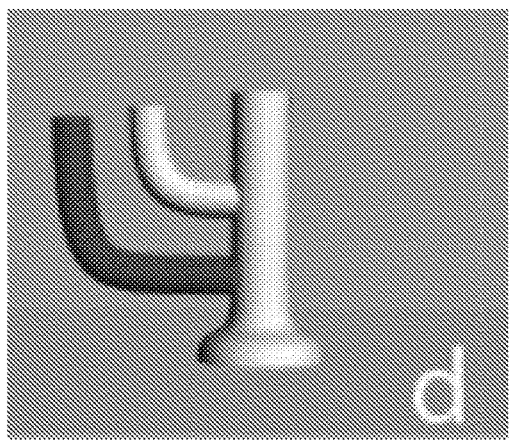
Figure 13E:
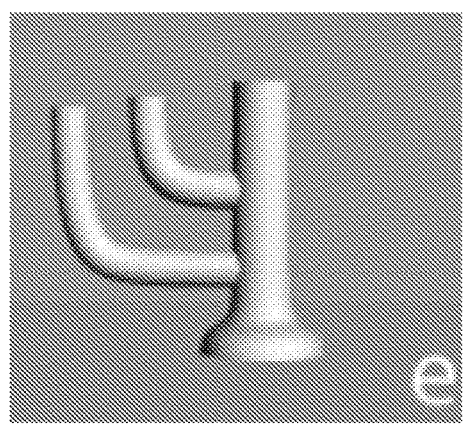
Figure 13F:
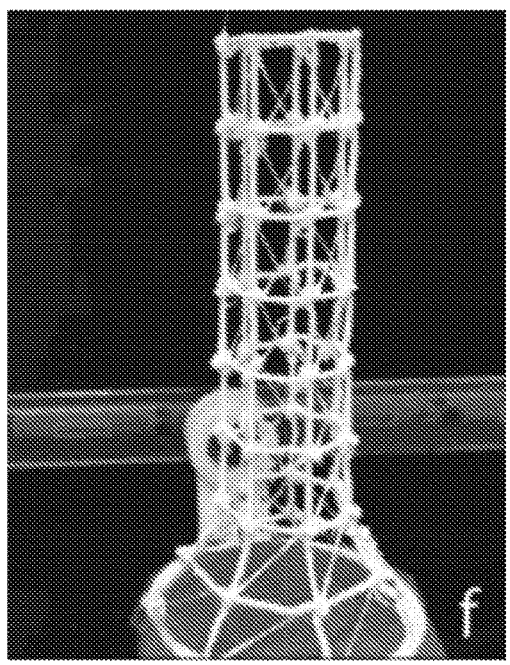
Figure 13G:
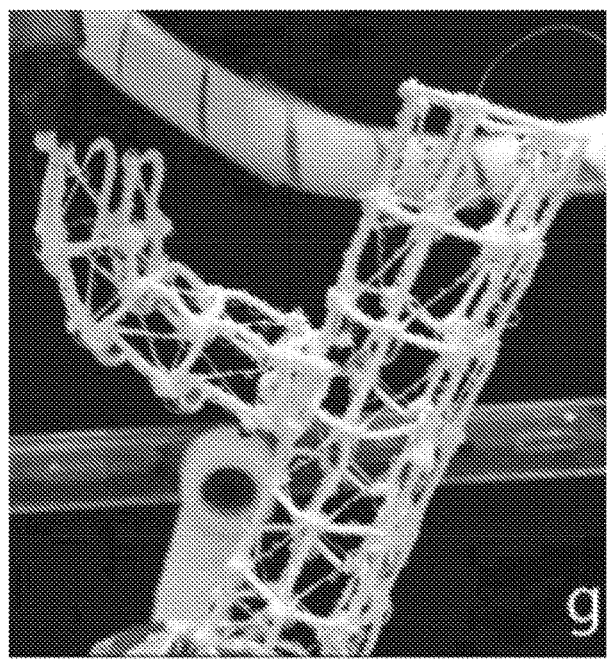
Figure 13H:
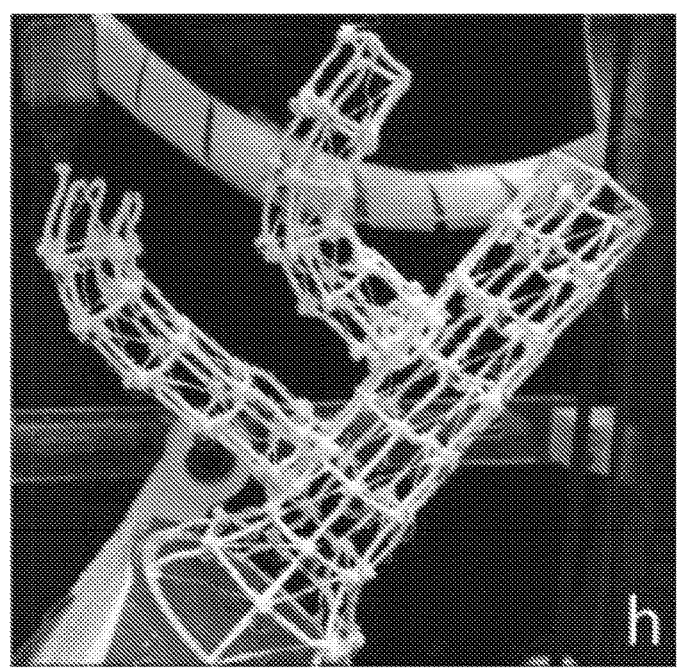

As in the case of additive geometry, when a subtractive primitive is smaller than the size of the mesh cells (especially when the primitive will fall entirely within a cell—see FIGS. 12A and 12B), a sacrificial patch may be created. The cutting operation may then be performed involving the sacrificial patch. As such, the method 200 may further comprise determining 218 if the cutting tool path will intersect a scheduled wireframe. If the cutting tool will not intersect the scheduled wireframe, a sacrificial patch is defined 221 for the scheduled wireframe. The sacrificial patch is designed to follow a surface of the primitive corresponding to the scheduled wireframe and also intersect the cutting tool path (i.e., be intersected by the cutting tool path such that the sacrificial patch is cut by the cutting operation). The sacrificial patch may then be scheduled 224 for printing on the 3D printer, the sacrificial patch being scheduled before the applicable cutting operation.

Collision Avoidance

To this point, the present disclosure has ignored problems that may be caused by collisions—where the printhead of the 3D printer collides with the already-printed geometry. Such collisions may be caused by, for example, design sequences that cause conflicts between the already-printed model and additional geometry. Methods of the present disclosure may include one or more of the following techniques as a staged approach to avoid such collisions.

Out-of-Order Printing

A first approach is to explore whether re-ordering the pending (scheduled) primitives will improve printability. This is possible because a 3D printer may lag behind the user's actions creating a queue of scheduled operations (print operations, cutting operations, etc.) For example, once a scheduled wireframe has been printed, the method may include the step of observing the queue of scheduled operations. A set of possible printing orders for the scheduled operations is computed, and a print order with the minimum number of conflicts is selected. For example, in the candelabra shown in FIGS. 13A-13H, the user may create the bottom branch primitive before the top branch primitive. As a result, the queue of scheduled wireframes will be ordered such that the bottom branch wireframe prints before the top branch wireframe—resulting in the potential for conflicts. Using the present out-of-order printing method, the printing order having the least number of conflicts will result in the print queue being re-ordered such that the top branch wireframe is printed before the bottom branch wireframe. To allow users to easily monitor the progress of the print operations, the system may provide an indicator of delayed features by, for example, color coding. For example, scheduled primitives that have not yet been printed may be displayed in color different from a color of already-printed components and/or a color of primitives that are not yet completed.

In the exemplary embodiment using the Rhino plugin, collisions are detected by positioning (virtually) a model of the printhead at each of the (U, V) nodes along the primitive mesh and using the Brep.IsPointInside( ) function to check for a collision. If a collision is detected at a given node, the printhead is moved to different orientations until a collision free direction is found (or a decision not to print the edge as further described below). Orientations may be sampled on a fixed grid over the hemisphere.

A similar method may be used to implement out-of-order printing. Given the list of scheduled wireframes, all possible printing orders are enumerated. For each order, a collision detection is used to evaluate the printability (with high printability assigned to the order when a tip of the printhead does not need to be repositioned). The system then selects the highest printability order to print. The present disclosure may be embodied as a method for scheduling operations of a 3D printer. The method includes calculating a set of possible sequences for a queue of scheduled operations and a number of conflicts for each sequence. A sequence is possible if, for example, it obeys any constraints for the scheduled operations in the queue. For example, if a scheduled operation (e.g., a cutting operation) is dependent on another scheduled operation (e.g., a printed mesh that will be cut by the cutting operation), the set of possible sequences may not include sequences in which the dependency is not satisfied. The method includes ordering the scheduled operations according to a sequence selected from the set of possible sequences, the selected sequence having the lowest number of conflicts. The method could be considered to select a sequence according to printability because printability may be related to a number of conflicts for a sequence.

In the same way, an embodiment of the above-described method for incrementally printing a 3D object may further comprise re-ordering scheduled operations. For example, once a wireframe of a completed primitive is generated, the wireframe may be scheduled for printing by adding it to a queue of scheduled operations for the 3D printer. The queued operations may be evaluated for re-ordering by calculating a set of possible sequences for the queue of scheduled operations and a number of conflicts for each sequence. The scheduled operations may then be ordered (re-ordered) according to a sequence selected from the set of possible sequences, wherein the selected sequence has the fewest conflicts.

Alternative Printing Orientation

Another approach is to relax the printing orientation using collision detection. For example, the system may default to orienting the model such that printing will proceed upward, from the bottom of the model to the top as such are defined by the user. However, if this orientation results in a conflict, the system may attempt to repose the object to avoid the conflict. A particular example can be seen in FIGS. 14A-14B, where the system prints the body of the dinosaur on its side to prevent collisions between the printhead and the previously printed legs of the dinosaur.

Omitting Geometry

Figure 14B:
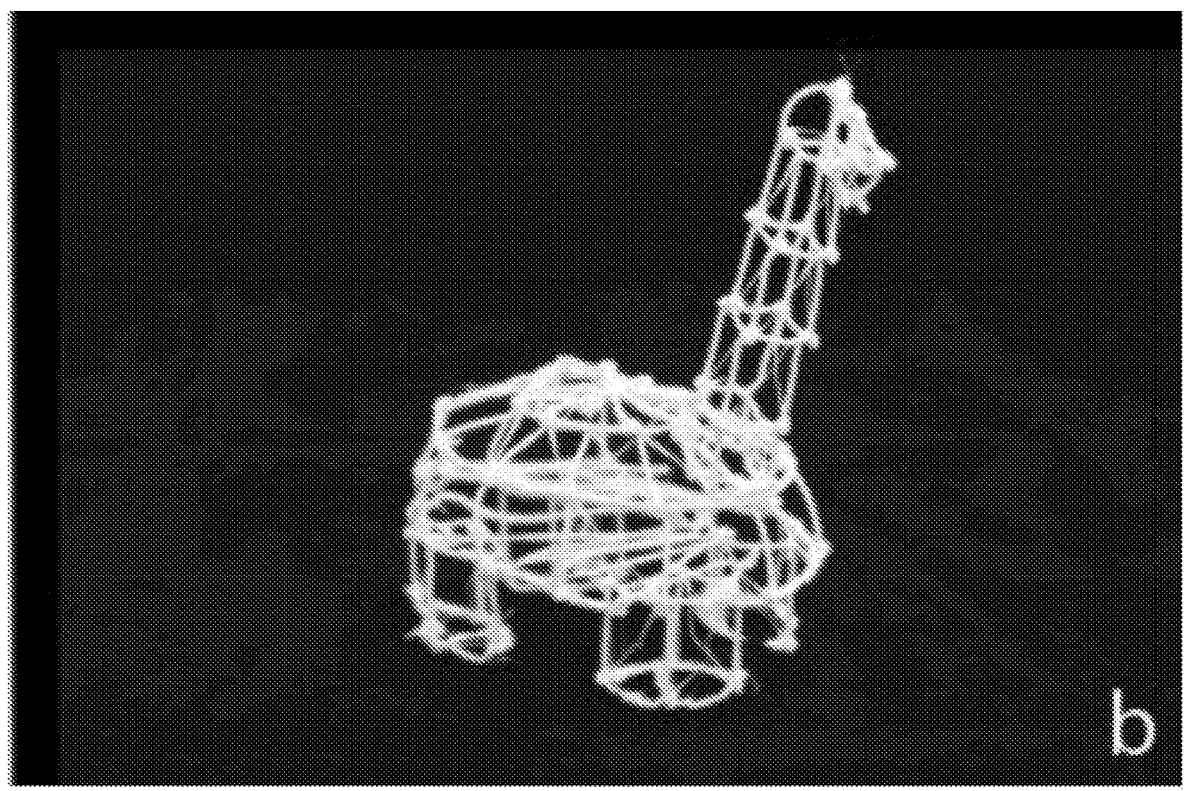
Figure 15A:
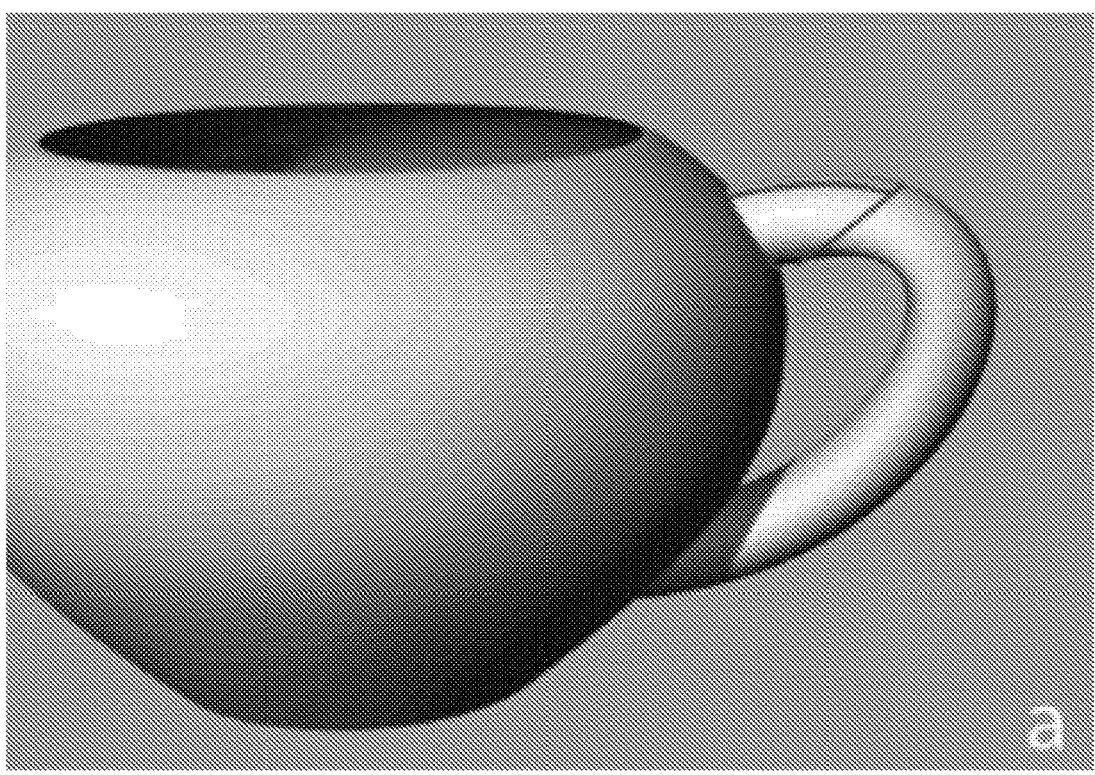
FIG. 15A depict primitives for a teapot.
Figure 15B:
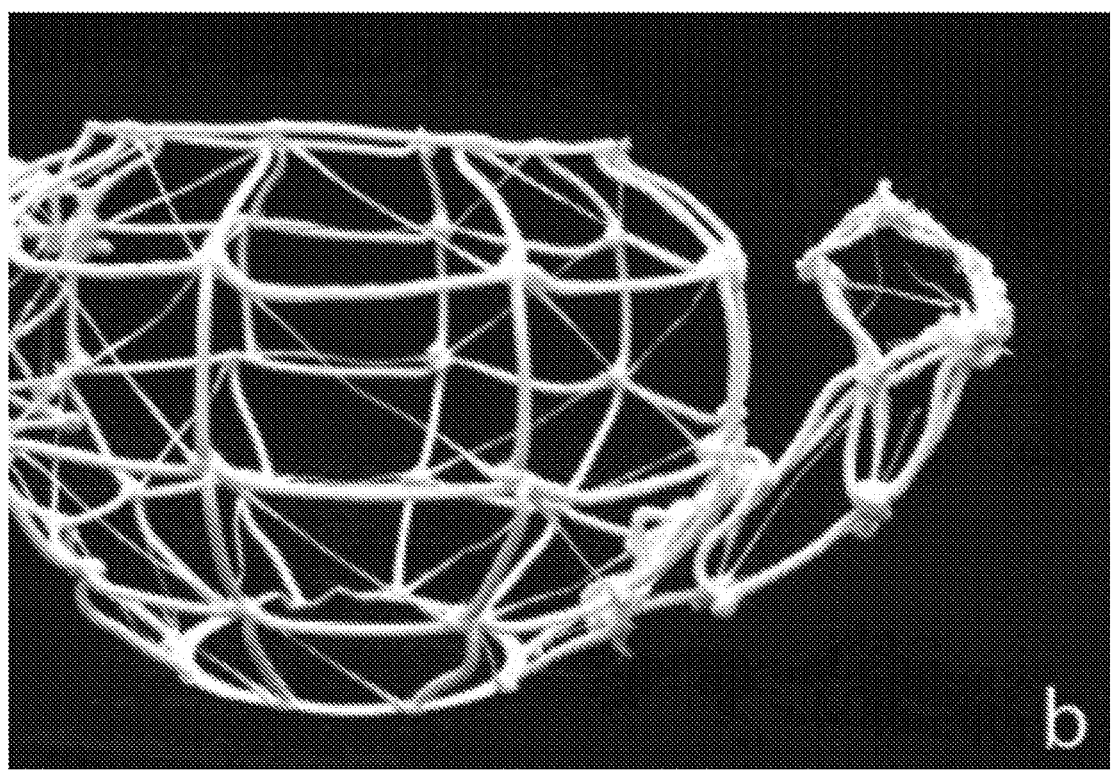
FIG. 15B shows a wireframe printed from the teapot of FIG. 15A, and showing where a portion of the teapot handle was omitted to avoid collisions.
Figure 16A:
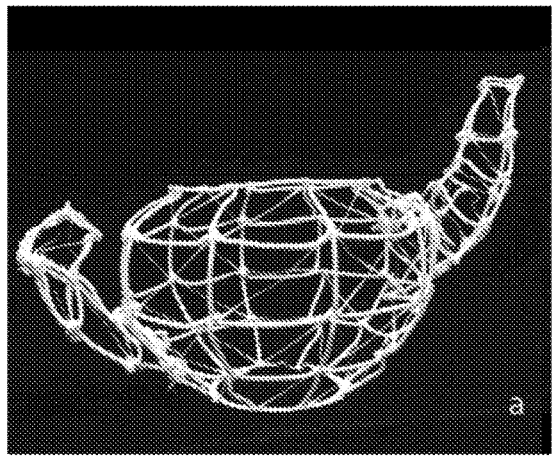
FIGS. 16A-16D depicts four different wireframes printed using methods according to embodiments of the present disclosure including: a tea pot printed in three steps (FIG. 16A), a Wright brothers' airplane printed in nine steps (FIG. 16B), a Panton's stacking side chair designed using a loft operation (FIG. 16C), and a glasses holder printed in three steps (FIG. 16D)
Figure 16B:
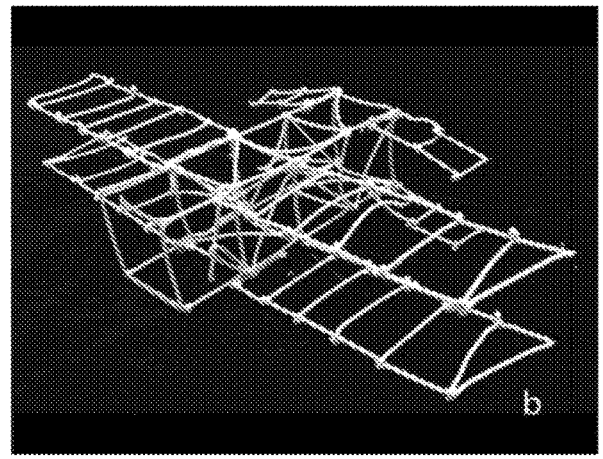
Figure 16C:
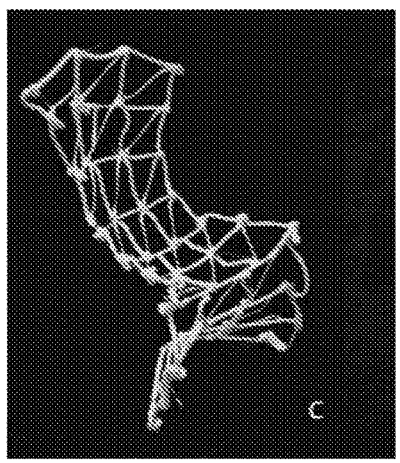
Figure 16D:
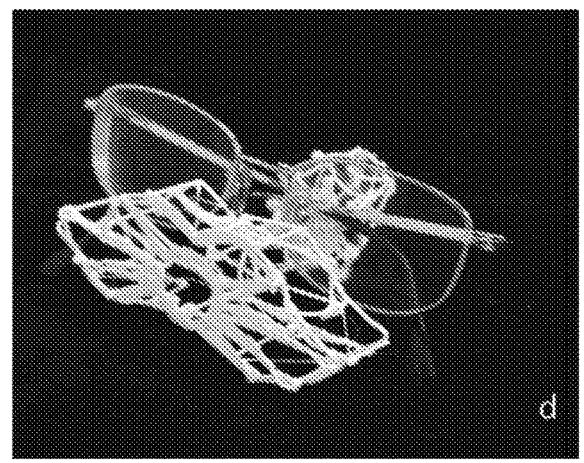

If collision avoidance strategies have been exhausted and a feature can still not be printed without collision, the system may attempt to print a portion of the wireframe that can be printed without collisions—leaving the portions that would cause collisions unprinted. Embodiments wherein a portion of a geometry can be omitted still meet an objective of the present disclosure is to provide a low-resolution overview of the model as it is designed with minimum impact on the user's workflow. For example, when creating the handle of the teapot shown in FIG. 15A, a portion of the handle is not printed because it is not reachable (FIG. 14B). It can be seen that the printed teapot still provides a usable representation of the object despite the unprinted portion. Similarly, the system will not attempt to print the inner walls of the through holes shown in FIG. 12A, resulting in the wireframes shown in FIG. 12B.

Pause and Manual Mode

While methods and systems of the present disclosure may operate in an automatic manner (automatically printing each component as the component is completed), other modes may be used. For example, in some embodiments, the user may manually pause the physical instantiation of the model. In this way, the user may try several designs in the digital realm without concerns related to printability or the physical costs of updates. When printing is resumed, the queue of scheduled wireframes may also provide opportunities for re-ordering for improved printability (as described above). The system may further provide a manual mode where the user has full control of the printing process such that wireframes are not printed until each is manually selected by the user.

System for Incremental 3D Printing

Figure 32:
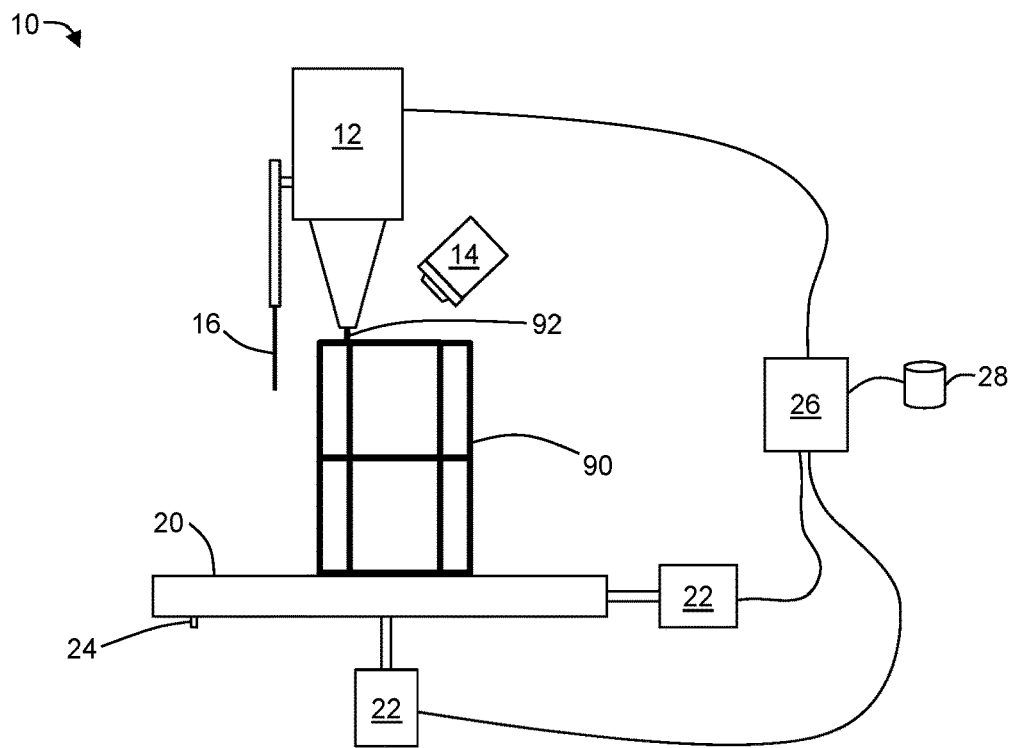
FIG. 32 is a diagram showing a system for incremental 3D printing according to another embodiment of the present disclosure.

With reference to FIG. 32, in another aspect, the present disclosure may be embodied as a system 10 for incremental 3D printing. The system 10 comprises a printhead 12 operable to deposit a filament 92 of print medium. The print medium may be a plastic, for example, acrylonitrile butadiene styrene (ABS); glass; metal; or any other material or combination of materials suitable for creating a filament as will be apparent in light of the present disclosure. The system 10 includes a base 20 on which the print medium is deposited to fabricate an object 90. The base may be in any configuration appropriate to the application. For example, the base may be configured as a small sphere. In another example, the base is configured as a platform or stage having a flat surface for depositing print medium. It should be noted that by small, the base may be ten centimeters or less, for example, 1 mm-10 mm or less or values in between, inclusive. A suitable base need only be large enough to provide an anchor for the filament. Of course, other embodiments may include bases larger than 10 cm. The system 10 includes one or more actuators 22 are provided for moving the printhead 12 and/or the base 20 relative to one another.

A processor 26 is in communication with the printhead 12 and the one or more actuators 22. The processor 26 is programmed to perform any of the methods described herein. For example, the processor 26 may be programmed to determine whether a primitive is complete; determine whether the primitive contacts an origin or a scheduled primitive; generate a wireframe of the primitive if the primitive is complete and if the primitive contacts the origin or a scheduled primitive; and operate the printhead 12 and the one or more actuators 22 to print the wireframe 90 of the primitive.

In some embodiments, the system 10 further comprises a cutting tool 16. For example, the cutting tool 16 may be a heated blade or other cutting tools appropriate to the print medium. The processor 26 may be further programmed to drive the printhead 12 to perform cutting operations using the cutting tool 16. For example, the processor 26 may be programmed to determine if a subtractive primitive is complete; define a cutting tool path at the intersection of the completed subtractive primitive and a printed primitive; and move the cutting tool 16 along the defined cutting tool path.

In some embodiments, the base 20 of the system 10 is removable. As such, the processor 26 may be programmed to pause printing operations (e.g., depositing filament, cutting operations, etc.) for removal of the base 20. The base 20 may further comprise one or more alignment components 24 for aligning the base 20 during reinstallation. The one or more alignment components 24 may be magnets, pins, tabs, notches, or any other such alignment device or combinations of such alignment devices.

In some embodiments, the system 10 further comprises one or more cooling device 14 for cooling deposited print medium. For example, the cooling device 14 may be a mist head, nozzle, fan, pressurized gas source, or any other cooling device or combinations of such cooling devices suitable to the application.

Figure 2:
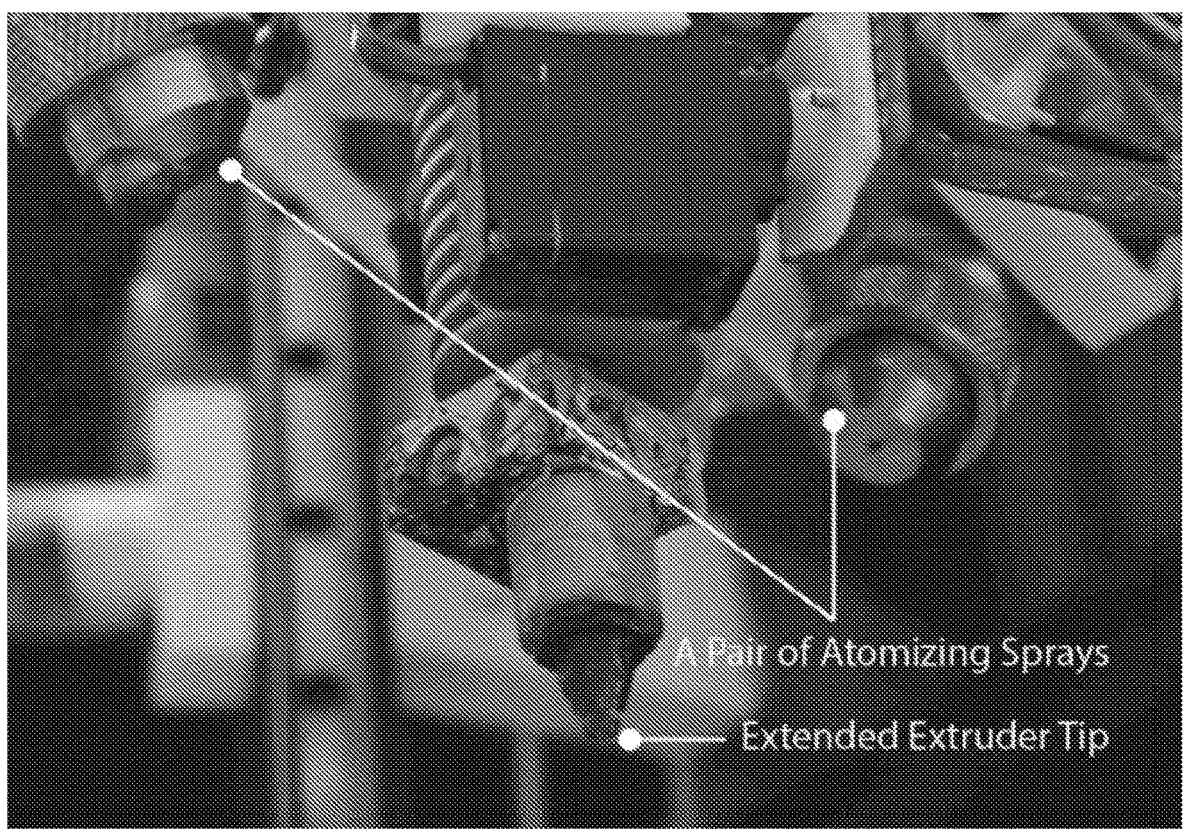
FIG. 2 is a detail view of a printhead of a 3D printer system according to another embodiment of the present disclosure, wherein an extended extruder tip and a pair of mist heads are labeled.

The ability of a 3D printer to quickly print basic primitives quickly is advantageous so that the printer can keep up with (or catch up to) the design of the digital model. In this regard, a wireframe printer provides a suitable starting point. Such a printer prints a wireframe mesh of the 3D object (e.g., a representation specifying each edge of the physical object where two mathematically continuous smooth surfaces meet, a representation connecting the object's constituent vertices using straight lines, etc.) The speed of a wireframe printer can be increased significantly by reducing the total number of cells to be printed—increasing the cell size. To do so, the printhead of a wireframe printer was modified to have an extended extruder tip to reach deeper into the model without collisions (i.e., without the printhead colliding with already-printed parts of the wireframe). FIG. 2 shows the modification of a hot end assembly of the exemplary printhead by adding a 15 mm pipe adaptor to extend its reach.

Figure 3A:
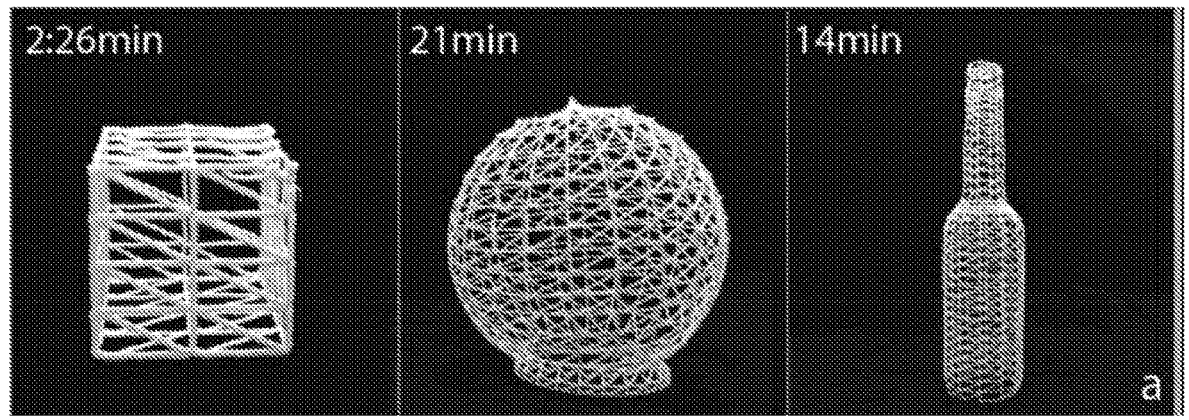
FIG. 3A shows a set of objects printed using a previous 3D printer system and each frame including the time required to print each object.
Figure 3B:
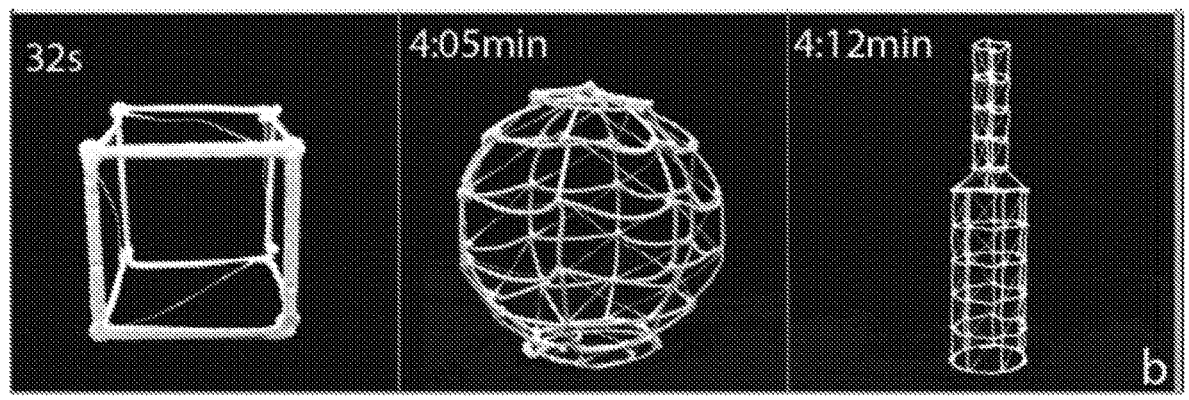
FIG. 3B shows a set of objects based on the same designs as the objects in FIG. 3A, and wherein the objects are printed on a 3D printer system of the present disclosure and showing the time to print each object.

To maintain the stiffness of the large-celled wireframe, the extruder tip was further modified to create a 1 mm strand of ABS. The chamber of the extrusion head was modified to maintain a temperature of 270° C. to speed up the extrusion of the thicker filament. However, using such a thick filament results in longer cooling times. To minimize the need for cooling pauses, one or more cooling devices may be added to embodiments of the present system. For example, two mist heads (e.g., atomizing nozzles) may flank the printhead (FIG. 2) to create a cooling mist that rapidly cools the extruded material. An exemplary embodiment using the modifications described above was able to print a 28×28×28 mm wireframe in 32 seconds as compared to 2 minutes and 26 seconds for the unmodified printer (FIG. 3). Similar comparisons were conducted for additional wireframes printed by the modified and unmodified printers (FIG. 3) resulting in speeds increased by a factors of 4.6, 5.1, and 3.3 respectively.

FIG. 16 shows several examples of models created with the exemplary test system, including a teapot, a model of the Wright brother's airplane, a chair inspired by Panton's stacking side chair created using a loft operation, and a glasses holder larger than the build platform. To enable fast preview, speed may be traded for accuracy by using low resolution representations of objects. In the early stages of the design process, low resolution models may be acceptable. In fact, low-fidelity models could be a benefit in that they may clearly communicate to viewers that the design is not finished, but is a sketch to be critiqued. However, low print resolution can be less desirable later in the design process when users may want to alter details of the object. The presently-disclosed system may allow users to balance the speed/resolution trade-off by providing the option to incrementally render accurate shells on specific areas of interest. Because the printer is conformal this will not always require a full reprint, as is the case with previous wireframe printers.

Print Modality

The printhead of any of the disclosed systems may be operable to deposit a filament of printed medium in any of various ways. For example, a printhead may eject a polymer coated filament as demonstrated by the 3D Cocooner device manufactured by Festo AG & Co. KG of Esslingen, Germany. In the Festo device, once the polymer coated filament is created by a spinneret, the filament is immediately cured by UV light to increase the rigidity of the filament. In another example, a suitable system may comprise a printhead wherein a filament is drawn from the printhead. In another suitable device, filaments may be deposited in a layerwise fashion, as demonstrated by, for example, the welding technique of a bridge-building device manufactured by MX3D B. V. of Amsterdam, Netherlands. The methods and systems disclosed herein can use any 3D print modality wherein a print medium can be deposited to create a filament.

Increased Degrees-of-Freedom

Figure 4:
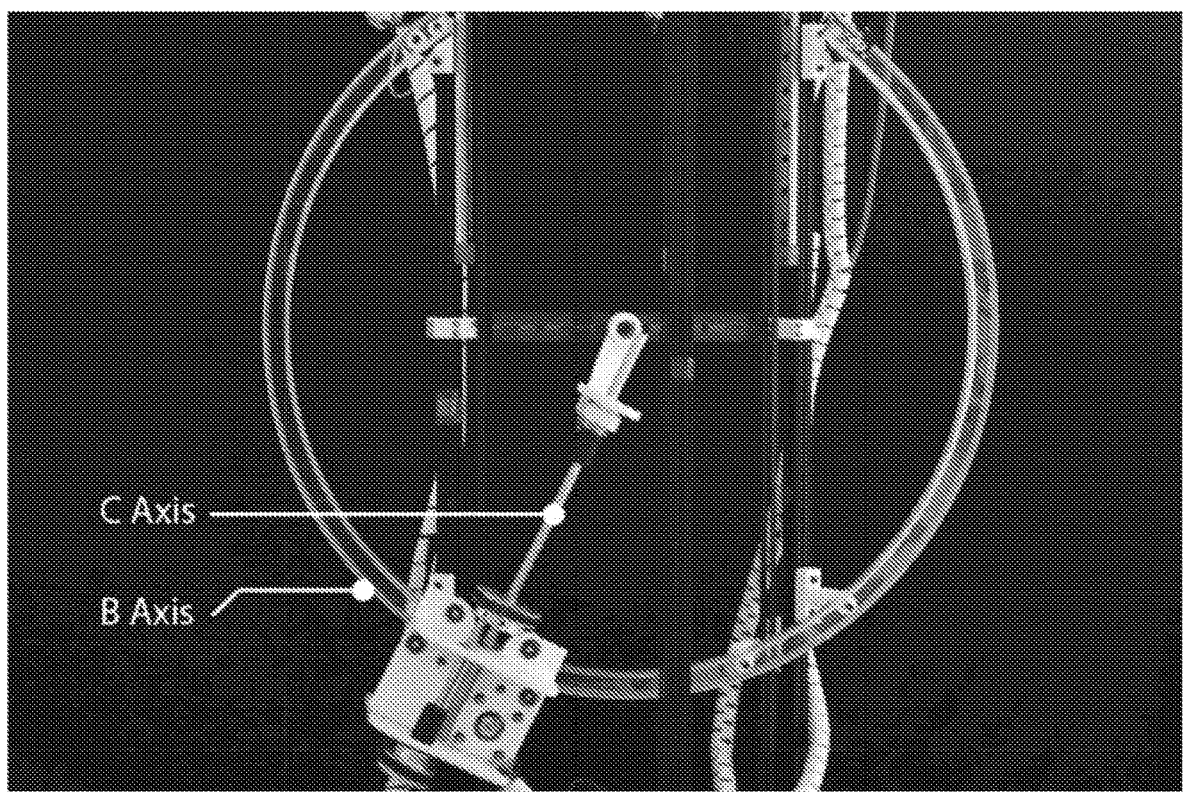
FIG. 4 is a top view of a portion of a 3D printer system according to the present disclosure, and showing the B axis and C axis of the base.

A system of the present disclosure may include three degrees-of-freedom (3DOF) or more. Reference to degrees-of-freedom are generally made with respect to the relative movement between the printhead and the base of a system. For example, the base may be stationary, while the printhead can move with 3DOF. In other embodiments, the printhead may be stationary, and movement is provided by the base. Still other embodiments may include movement for both the printhead and the base. 3DOF printers are common for 3D printing. In some embodiments, the system comprises at least five degrees-of-freedom (5DOF). In an exemplary embodiment, an off-the-shelf delta 3DOF printer, wherein the printhead moves while the base is stationary, was modified such that the base could move with two additional degrees-of-freedom, resulting in a 5DOF printer. The relative movement may be translational, rotational, or a combination of these motions. For example, in the above 5DOF printer where the base was modified for movement, the degrees-of-freedom added were rotation of the printer base about the Y axis (termed the B axis) and rotation of the base around the Z axis (termed the C axis) (FIG. 4).

It was found that the addition of two rotational degrees of freedom (DOF) to an off-the-shelf delta printer would allow modifications to be made to all parts of the model, not just the easily-accessible top portion. An exemplary printer was constructed using a circular rail of 260 mm radius for the B axis, so as to maximize the accessible print volume. To lower cost, this rail was made of two 6 mm-thick acrylic layers glued together to create a butterfly profile. The range of motion was +/−120°. The C axis was able to rotate indefinitely. To accommodate the circular rail, the height of the printer was increased by changing the support rails. The resulting printer was inexpensive and utilized easily fabricated parts in the spirit of the delta printer design.

Compared to previous 5DOF designs, this exemplary printer design created a large open space around the model to provide easy access for the printhead. Further, a fully synchronous 6DOF system was used (5DOF for motion and 1DOF for extrusion), so that instead of printing and cutting in a layer-based manner, the printer used conformal printing and cutting. This generally resulted in improved physical rendering and quicker cutting operations.

Cutting Operations

Figure 6A:
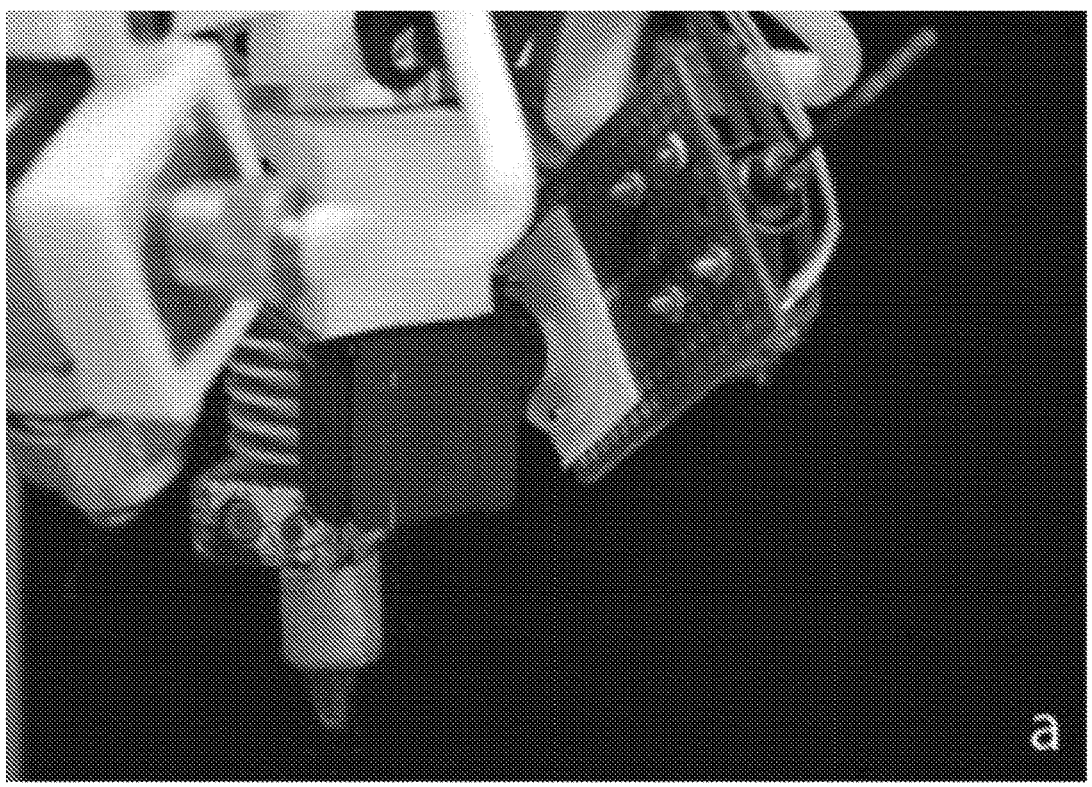
FIG. 6A shows a cutting tool of a system according to an embodiment of the present disclosure, wherein the cutting tool is in a stowed position.
Figure 6B:
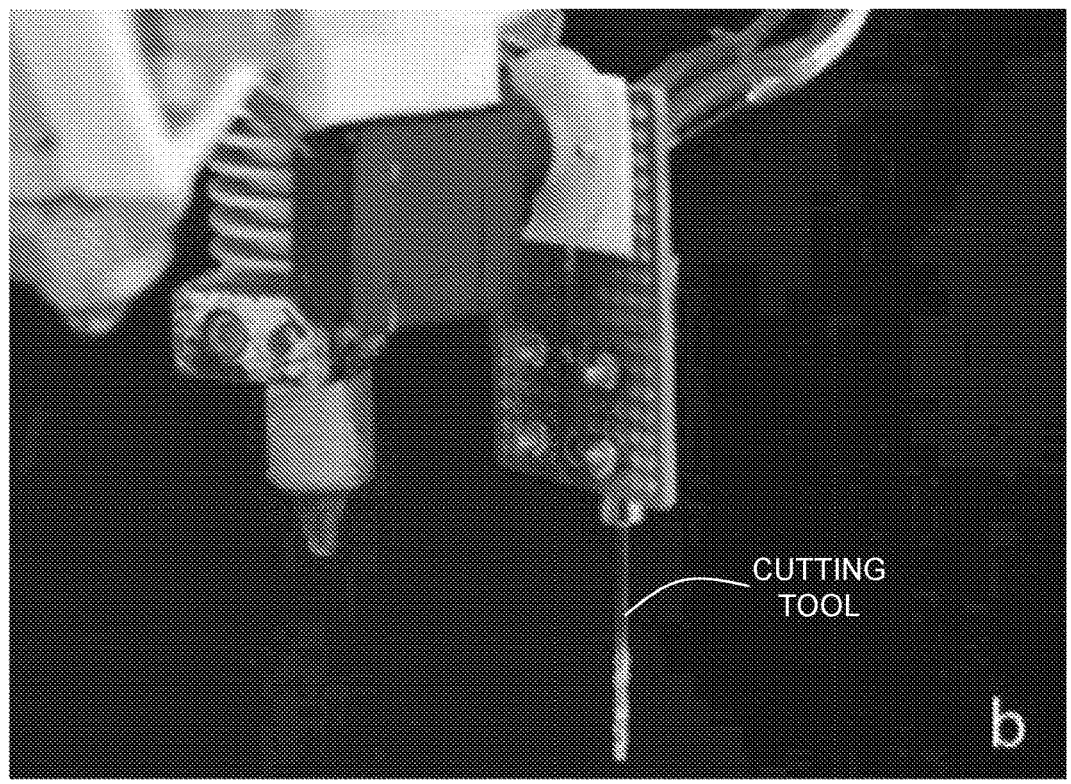
FIG. 6B shows the cutting tool of FIG. 6A in an operational position.

Embodiments of the presently-disclosed system may further include a cutting tool to allow a user to correct mistakes, adjust geometry, perform subtractive operations, etc. In such embodiments, the processor may further be programmed to determine if a subtractive primitive is complete; define a cutting tool path at the intersection of the completed subtractive primitive and a printed primitive; and move the cutting tool along the defined cutting tool path. It was found that a wireframe printed using, for example, ABS, could be cut using a heated cutting blade. The blade may be actuated so as to be tucked away in a stowed position when not in use (FIG. 6). When cutting is needed, the blade is moved to a cutting position. In the exemplary printer, the cutting position was 15 mm lower than the tip of the printhead to sufficient clearance around the cutting tool. This actuated blade design proved to be significantly faster than other embodiments where the cutting tool was manually installed when needed. The cutting tool (FIG. 6) was created by adapting a heating cartridge and a thermistor to fit a cutting blade. The assembly was attached to a small servomotor so that the cutting tool could be raised when not in use. The heating cartridge was set to 350 and the cutting tool was able to easily cut 1 mm thick ABS wires.

Calibration

Figure 5A:
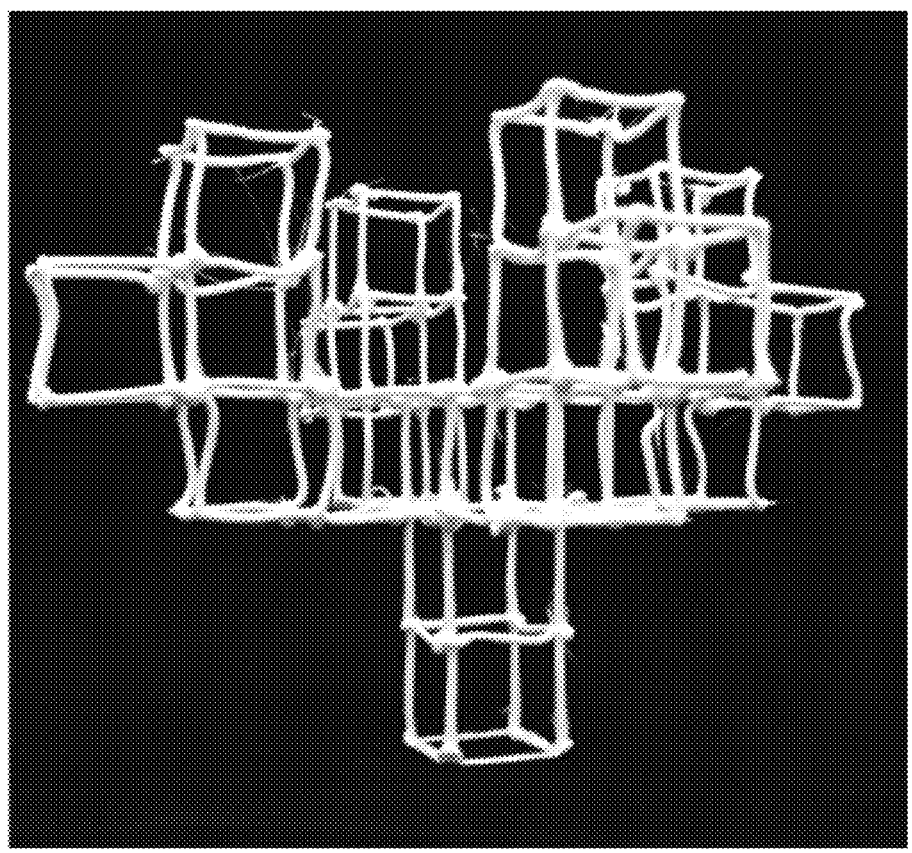
FIG. 5A shows a wireframe object printed using a calibrated system according to the present disclosure.
Figure 5B:
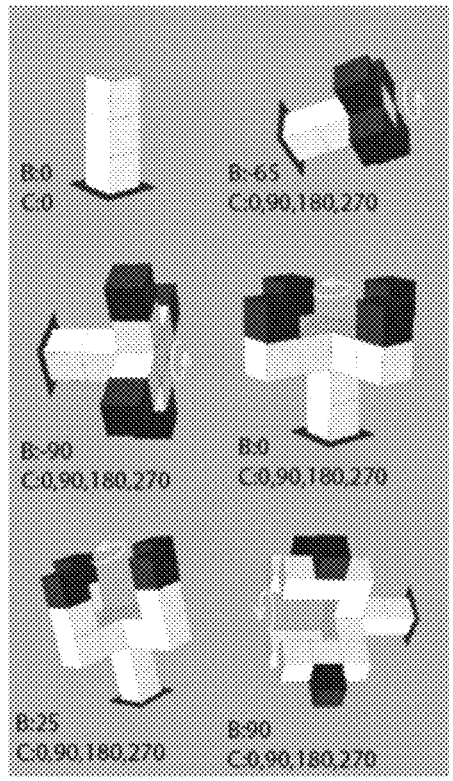
FIG. 5B shows various orientations used to print the wireframe of FIG. 5A.

Despite the relatively low cost and ease of fabrication of the exemplary printer, with the proper calibration, it had sufficient precision for fast and incremental wireframe printing. For example, a computer vision calibration system allowed the printer to reach RMS positioning error of 0.5 mm, which is sufficiently small compared to the 1 mm diameter nozzle. The exemplary calibration system included two stationary cameras on the side of the printer to capture images of a cube placed on the base for 114 combinations of B and C angles. A calibration program was configured to recognize checkerboard patterns attached to five sides of the cube and then compute an initial estimate of the intrinsics and extrinsics of the camera-checkerboard system. Given those estimates as input, printer used known techniques to recover the precise poses of the base at the corresponding angles. With these samples, the printer is then able to interpolate the data to predict the pose of the base given an arbitrary combination of B and C angles. The exemplary calibration system was configured to model the B axis rotation as rigid body motion and fit a circle to the translational part of the pose samples. Then, the calibration system interpolated the deviation from the best-fit circle to obtain the translation given an arbitrary B angle. Spherical linear interpolation was used to obtain the rotational part. The motion of the C axis is well-modeled as a rotation, so the calibration system was configured to solve for the unknown rotation axis using the calibration data. To demonstrate the calibration results, a model with multiple stacked cubes printed from different angles is shown in FIG. 5. It is noted that all nodes are aligned and well connected.

Printability

Figure 17:
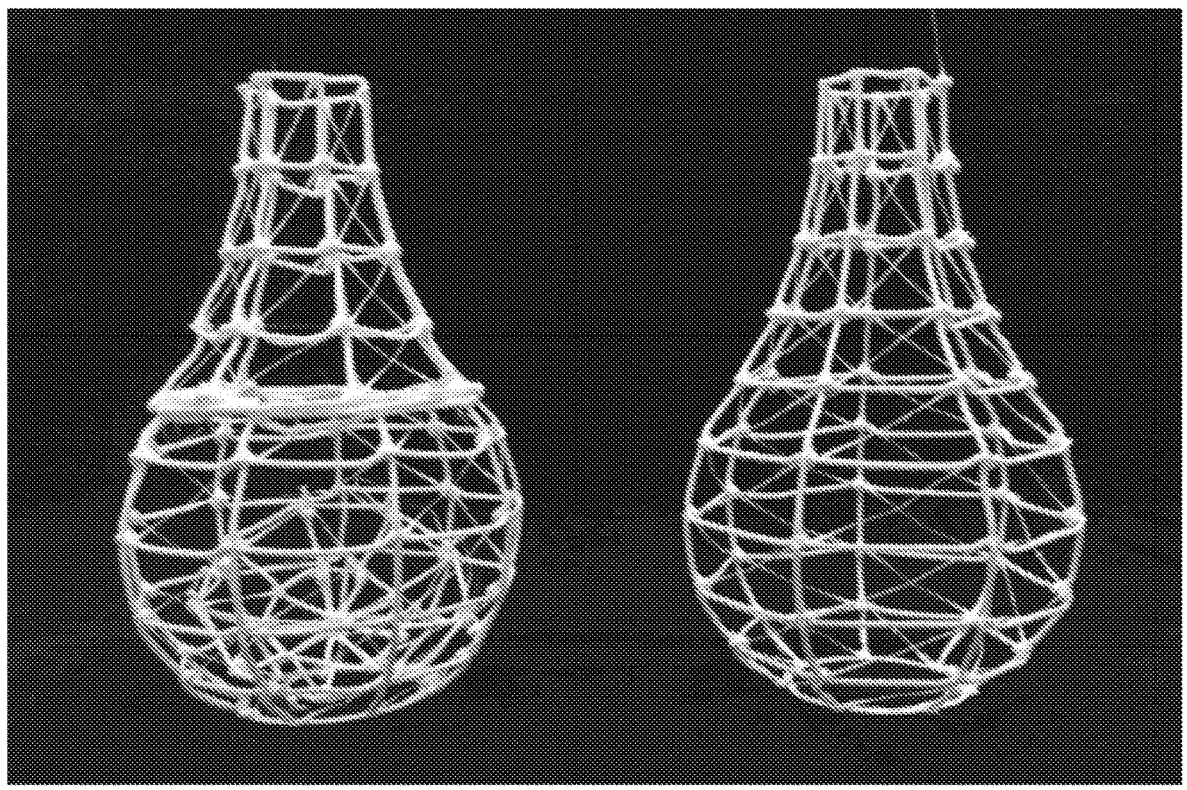
FIG. 17 depicts a vase created in CAD in a multi-step approach (left) compared with a vase created using a single-step approach (right)

Systems and methods of the present disclosure may be configured to allow the user to create any geometry, but this may result in some portions left unprinted. Printability or even final results may therefore depend on the steps by which a model is created. As an example, FIG. 17 shows the same vase created either in a stepwise modification of a sphere (left side of figure) or in a single step via revolution of a profile (right side); each ends up with a different physical rendering of the same design. The left side vase also shows where a top section of the sphere has fallen into the model during the modification (cutting) process.

Printing Wireframes from Arbitrary Meshes

In another aspect, the present disclosure provides a method 300 for 3D printing a wireframe. The wireframe may be an arbitrary mesh—i.e., any mesh for which there exists a feasible printing order (a "printable mesh"). A model to be printed is received, the model comprises a plurality of edges. To print a wireframe of the model, an edge print schedule having an ordered list of edges is generated as well as coordinates for each vertex of the edges. A feasible printing plan advantageously obeys two types of constraints—support and collision. Support constraints require that every edge must be connected to already-printed parts. Collision constraints require that the printhead of the printer does not collide with printed edges. Either type of constraint may be solved on its own by polynomial-time processes, leading to a choice of two strategies: enforce the support constraints first, then fix the solution to avoid collisions; or plan around collisions first, then choose a support-compatible ordering. Processes considering support in isolation often "paint themselves into corners" where collision-free orientations do not exist, and heuristics are not often helpful to solve this. Because support has been found to be easier to satisfy, the present method enforces collision constraints first.

It should be noted that the orientation of the printhead is related to the model's frame of reference. As such, for the 5DOF printer described above, in addition to the position of the printhead in 3D Cartesian space, two extra degrees of freedom were added by including two rotation axes for the base. In the model's frame of reference, this means the edges can be printed with the printhead approaching from any direction in the upper hemisphere—this is referred to herein as the printing orientation of an edge.

Figure 31:
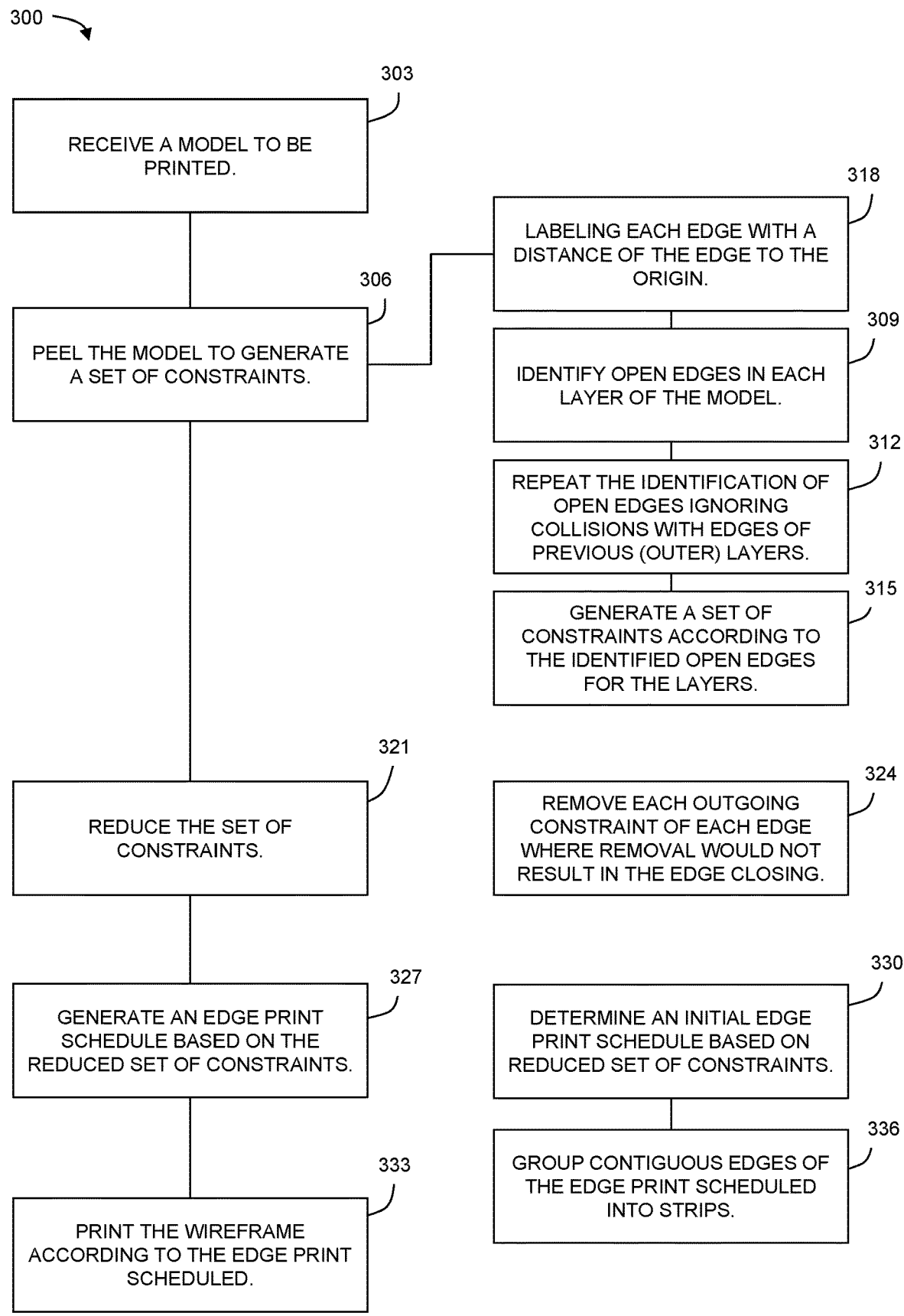
FIG. 31 chart showing a method for printing a wireframe according to another embodiment of the present disclosure.

With reference to FIG. 31, and as further described below, the presently-disclosed method 300 comprises receiving 303 a model to be printed. The model is peeled 306 to generate a set of constraints for an edge print schedule. The model may be considered in layers, each layer comprising a set of edges that may be printed using a printhead of a 3D printer, where the printhead would not collide with an already-printed part of the model. As such, each edge that can be printed in at least one orientation of the printhead without collision is identified 309 as an "open" edge. This identification 309 of open edges may be repeated 312 for each layer (additional layer) of the model, where open edges of previous layers are ignored for the purposes of collision (as further described below, the previous layers will be printed after each additional layer and may therefore be ignored when identifying collisions). In other words, it can be considered that each layer is "peeled" 206 from the model in identifying 309 the open edges of the subsequent layers. In this way, a set of constraints on the ordering of edges is generated 315 to ensure collision-free printing orientations will exist for each edge. In some embodiments, as further described below, these constraints are encoded as collision arcs in a directed graph in which each node represents a mesh edge, and each collision arc represents a constraint indicating that one mesh edge must be printed before another.

In some embodiments, the edges are labeled 318 according to the distance of the respective edge from an origin (the origin corresponding to the base of a 3D printer). In such embodiments, the identification 309 of open edges is prioritized based on this labeled 318 distance from the origin.

The method 300 further comprises reducing 321 the set of constraints by removing 324 redundant constraints. For example, the set of constraints may be reduced 321 by removing 324 each outgoing constraint of each edge of the model where removal would not result in the edge becoming closed.

The method 300 further comprises generating 327 the edge print schedule based on the reduced set of constraints. The edges are ordered, building the model back up by adding strips one at a time, ensuring that every edge is attached to already printed ones while observing the constraints of the set of constraints. In each iteration, the contour separating printed edges from unprinted edges is advanced by one step, first printing the edges between the old and new contours, then printing the new contour. In order to keep the contours smooth, a cost is defined for each edge, and minimizing the cost of the new contour was found to correspond to finding a minimum cut on a dual graph to a portion of the surface. The edge print schedule may be generated 327 by determining 330 an initial edge based on the reduced set of constraints; and grouping 333 contiguous edges of the print schedule into strips. The wireframe is printed 336 according to the edge print scheduled.

Complexity of Tool Path Planning

While tool path planning for traditional layerwise printing is trivial, planning for conformal print, especial with 5DOF, is a fundamentally different problem. Printing orientations need to be determined and collision needs to be considered so that already printed wireframes do not collide with the printhead. The planning problem may be broadly considered as ordering the edges of the input mesh into a sequence, and choosing a printing orientation for each edge. This is typically prone to be constrained by collisions—a naive ordering of edges often leads the printer to paint itself into a corner where certain edges cannot be approached, from any direction, without colliding into what has already been printed.

A feasible printing plan advantageously has two properties. First, every edge must be connected to (in contact with) what is already printed or the printer base—edges cannot be printed in mid-air. And when printing an edge, the printhead should not collide with previously-printed parts. Beyond these two properties, not all feasible plans are equally desirable. For example, printing in smooth, uninterrupted strips generally leads to better results.

Although the presently-disclosed process is described with reference to wireframe printing, it should be noted that variations of the method can be applied to other scheduling problems involving collision-constrained automated assembly or high DOF additive manufacturing processes.

Avoiding Collisions

Figure 21:
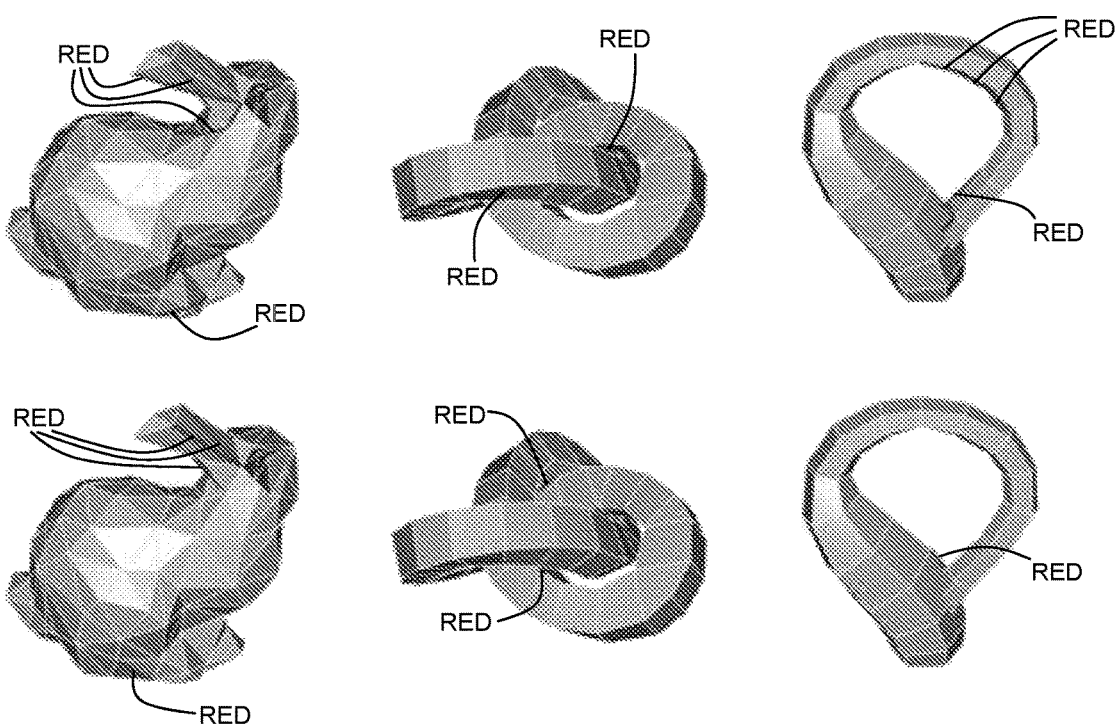
FIG. 21 is a series of diagrams showing unprintable edges of the depicted objects using naïve transversal.
Figure 22:
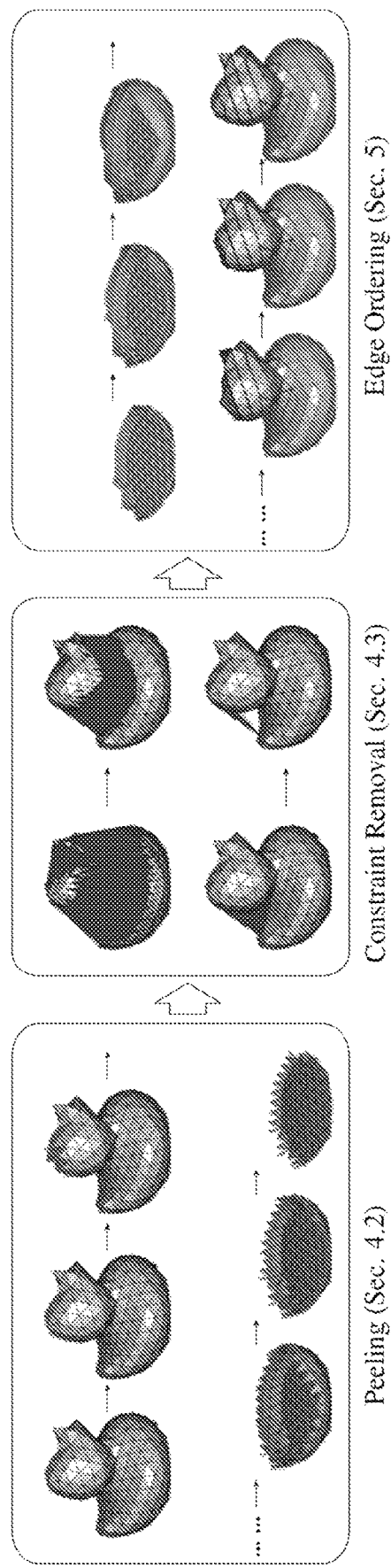
FIG. 22 is a diagram showing three phases of an embodiment of a method for printing according to the present disclosure for a duck model, and showing: peeling, constraint removal, and edge ordering.

A process that makes only local decisions in scheduling edges often gets into a situation where the next edge cannot be printed in any orientation without the printhead colliding with already-printed parts of the model (FIG. 21). Further, batching edges into contiguous strips has been found herein to provide better results, and greedy strip-building methods run into unprintable edges even more often. Embodiments of the presently-disclosed method solve this problem by constructing a partial order on the set of edges such that any compatible total order will always have a feasible printing orientation for every edge. By minimizing the number of constraints, the edge ordering process (further described below) has improved flexibility to construct good strips while avoiding collisions.

TABLE 1

A table of symbols used herein

| Symbol | Meaning |
| --- | --- |
| G | Full collision graph |
| G' | Subgraph |
| V | Set of nodes in collision graph |
| E | Set of arcs in collision graph |
| E' | Subset of arcs |
| D | A descrete set of all available printing |

TABLE 1-continued

A table of symbols used herein

| Symbol | Meaning |
| --- | --- |
| | orientations |
| $R_c(e)$ | Orientations associated with arc e |
| $S_c^i(v)$ | Orientations causing self-collision when printing node v from the i-th vertex |
| $D_o^i(v)$ | Open orientations of node v |
| $D_c^i(v)$ | Closed orientations of node v |
| $S^i$ | i-th peeling layer |
| S | $S = S^0 \cup S^1 \cup \ldots \cup S^n$ |
| R | Remaining set of nodes after peeling |

Problem Formalization

When printing an edge A in a particular orientation, there is a collision if and only if some previously printed edge B overlaps the volume occupied by the printer mechanism (e.g., the printhead). A collision can be avoided either by printing A before B or by printing A in a different orientation where B does not interfere. The present disclosed method may be accomplished by way of a collision graph that encodes these relationships between printing order, printing orientation, and collision.

In the full collision graph G(V,E), nodes correspond to mesh edges and directed arcs correspond to collision constraints, where $(v_a, v_b) \in E$ means that printing $v_a$ after $v_b$ causes a collision in at least one orientation. To avoid ambiguity, edges of the model to be printed (nodes in G) are referred to herein as "edges," and edges in G are referred to herein as "arcs." Furthermore, vertices of the mesh are referred to as "vertices," and vertices in G are referred to as "nodes." For example, in FIG. 23, G is the full collision graph of a tetrahedron. The six nodes in the graph correspond to the six edges of the tetrahedron.

Because printability depends on orientation, each arc and node of G has an associated set of orientations, selected from a finite sampling $D \subset S^2$. Given an arc in the graph, the map $R_c: E \rightarrow (2^D \setminus \{0\})$ records the set of colliding orientations for the pair of nodes on this arc: $\omega \in R_c((v_a, v_b))$ means that $v_a$ cannot be printed in orientation $\omega$ after $v_b$ has been printed; if $\omega' \notin R_c((v_a, v_b))$ then it is safe to print $v_a$ after $v_b$ in orientation $\omega'$. For example, in FIG. 23, there are three printing orientations. The shaded sectors of the circle on an edge indicate the set of orientations that cause collision. For example, edge b cannot be printed in orientations 2 after edge e is printed, so there is an edge from b to e and orientation 2 is shaded on this edge. In an exemplary embodiment used for testing, 305 directions were uniformly sampled on the upper hemisphere for D, and collision were detected for every pair of edges by checking whether the printhead geometry intersects one edge when moving along the other. It is also possible for an edge to collide with itself while printing from some orientations; to encode this there are also two maps $S_c^1, S_c^2: V \rightarrow 2^D$ that record the infeasible orientations due to self-collision: $\omega \in S_c^1(v)$ (resp. $S_c^2(v)$) means it is not safe to print v in orientation $\omega$ when starting from the first (resp. second) endpoint.

With the constraints of the problem encoded in G, $R_c$, and $S_c^i$, the collision avoidance problem can be formalized in terms of choosing a subgraph $G'(V, E' \subset E)$ of the full collision graph, which represents the particular subset of collision constraints intended to be followed: $(v_a, v_b) \in E'$ means that $v_a$ will be printed before $v_b$. G' should to have two properties to be a solution: first, it is acyclic, because a cyclic graph will have conflicting constraints, in which two mesh edges must each be printed before the other; and second, there is some feasible printing orientation for every edge. These two properties are in tension: more edges in the subgraph put more constraints on the ordering, providing more guaranteed feasible orientations, but the subgraph is also more likely to be cyclic.

An orientation ω is said to be open in G' for an node v if the constraints in E' guarantee that v can be safely printed in orientation ω; otherwise ω is said to be closed in G' for v. It follows from the meaning of $R_c$ and $S_c^i$ that in G'(V,E'), the set of open orientations of a node v is $$D_o^{i(v)} = \left( \bigcap_{e \in E_v \setminus E'_v} \overline{R}_c(e) \right) \cap \overline{S}_c^i(v), i = 1, 2 \quad (1)$$

where $E_v$ and $E_v'$ are the outgoing arcs of v in G and G' respectively; $\overline{R}_c(e)$ and $\overline{S}_c^i(v)$ are the complements of $R_c(e)$ and $S_c^i(v)$ in D respectively. That is, an orientation of a node v is open if and only if (a) it does not cause self-collision and (b) the subgraph requires all nodes that would prevent printing v in this orientation to be printed after v. For example, in $G_3'$ of FIG. 23, orientations 2 and 3 of a are open. Although printing a in these orientations would collide with e and f, the arcs present in $G_3'$ require e and f to be printed after a, so printing a in these orientations is safe. Orientation 1 of a is closed, because printing a in this orientation collides with d, and d may be printed before a since arc (a,d) is absent in this subgraph.

As with $S_c^1$ and $S_c^2$, $D_o^1$ is the set of orientations that are open for printing v starting from its first endpoint, and $D_o^2$ is for starting from its second endpoint. And the set of closed orientations is $D_c^i(v) = D \setminus D_o^i(v)$.

Figure 23:
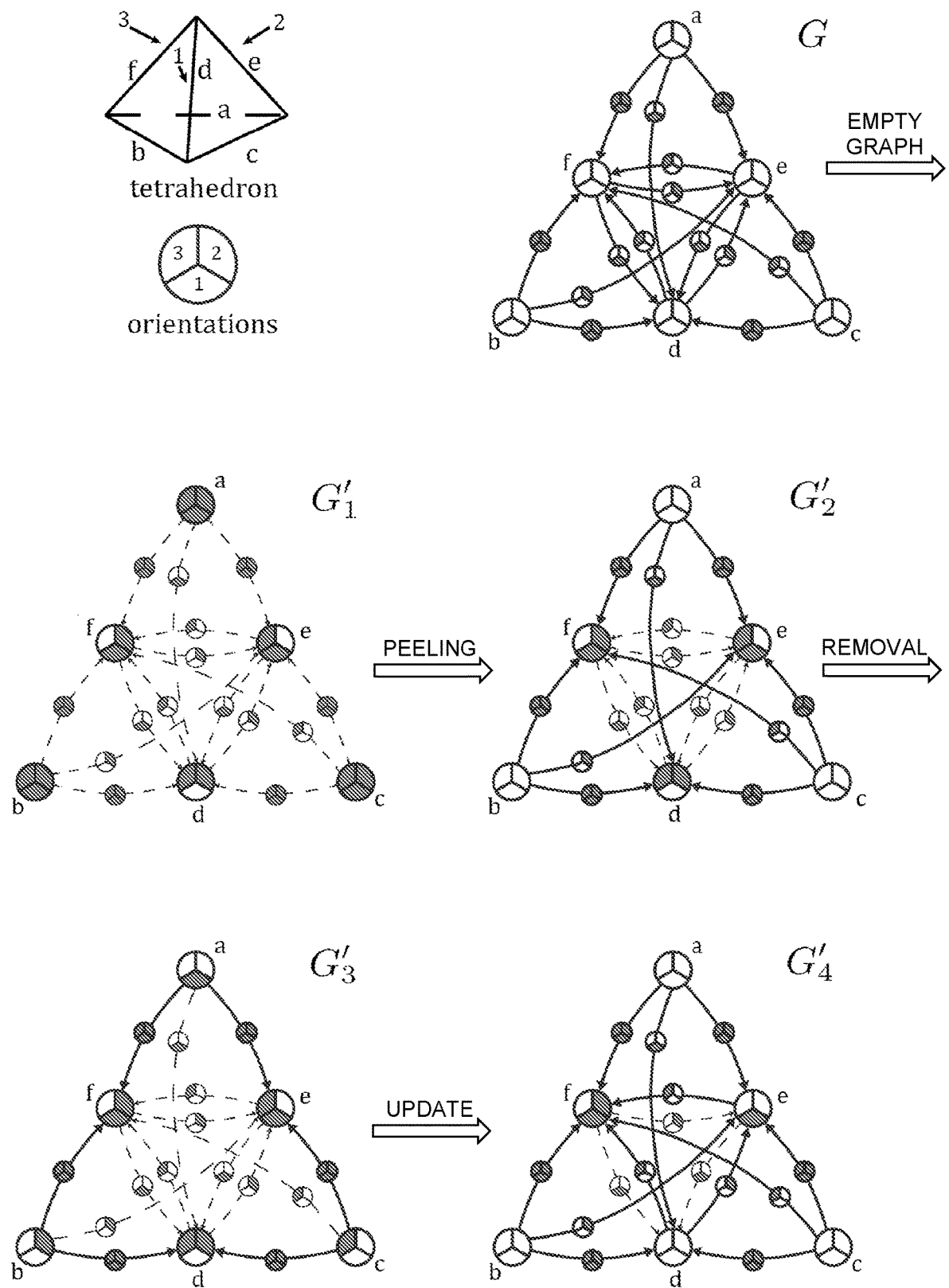
FIG. 23 is a series of collision graphs for a tetrahedron at different stages of a method according to an embodiment of the present disclosure.

A node v is called open if $D_o^1(v) \cup D_o^2(v) \neq \emptyset$. Finally, a goal can be stated briefly: find an acyclic subgraph G'(V,E') for which all nodes are open. Such a graph is referred to herein as a feasible acyclic subgraph. In FIG. 23, $G_2'$, $G_3'$, and $G_4'$ are all feasible acyclic subgraphs. In the full graph G, all orientations of all nodes are open, but it is not a solution because it is cyclic and an order that obeys all the constraints cannot be found. In the empty graph $G_1'$, there are no constraints so the nodes can be printed in any order, but it is not a solution either, because nodes a, b, and c are closed and not guaranteed to be collision-free.

Resolving the Collision Graph

A feasible acyclic subgraph of G may be found by a process including removing and adding back arcs. The first phase of the process is based on the observation that, for any printable mesh, there must be edges that can be printed after all other edges have been printed. These edges can be printed last so they do not interfere with others. If such edges are placed at the end of the sequence (the edge print schedule), some of the other edges can be printed just before them. This can be done recursively until all the edges are considered. The procedure is like peeling an onion and is referred to herein as "peeling" (see Process 1 below).

---
Process 1

Label each node with the length of its shortest path from base
Remove all arcs in the graph
Let $S^0$ be the set of nodes that are open and have maximum label
i ← 0.

---
Process 1 -continued while (not all nodes are open) && ($S^i \neq \emptyset$) do
    Add back all arcs incident to nodes in $S^i$, except for arcs from $S^j$, j ≤ i.
    $S^{i+1}$ ←the set of nodes that are open after adding these arcs and have the maximum label
    i ← i + 1
end while
n ← i.
R ←the set of nodes that are not opened by the process above.
if R == ∅ then
    We can print in the order of $S^n, S^{n-1}, \ldots, S^0$.
    Nodes in the same subset $S^k$ can be printed in arbitrary order.
else
    We cannot resolve this collision graph
end if

---

Figure 24:
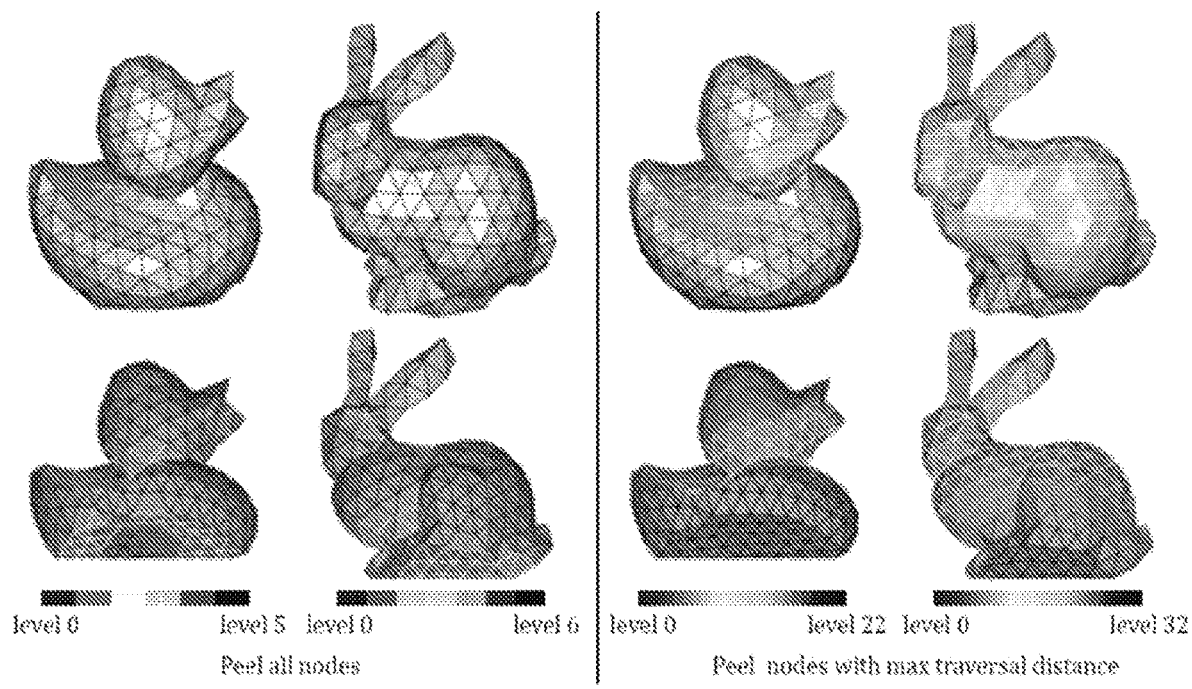
FIG. 24 depicts the results of the peeling process (the color map below the each model indicates the level of the nodes during peeling)

In each iteration of the peeling, either all nodes that are newly opened or only a subset of them can be peeled. In practice, it has been found that peeling all newly-opened nodes often puts too many constraints on the order of edges, such that edges have to be printed without support, see FIG. 24. To address this, it was found to be advantageous to schedule edges far from the printing base before those near the base. So edges are arranged to prefer retaining collision arcs that point away from the base as measured by traversal distance. To achieve this, before the peeling, each node is labeled with the length of the shortest path between the base and itself. Then at each step, only the nodes having the maximum label among the newly opened nodes are peeled. This makes the process tend to follow the reverse traversal order and add a small set of constraints each time, which reduces the chance of having to print unsupported edges.

A simple example of the peeling process is shown in FIG. 23, which begins with the full collision graph G. All arcs are removed, resulting in the empty graph $G_1'$. In $G_1'$, nodes d, e, and f are still open, so $S^0 = \{d, e, f\}$. Then, edges incident to the nodes in $S^0$ are added, resulting in graph $G_2'$. In $G_2'$, nodes a, b, and c are also opened, so $S^1 = \{a, b, c\}$ and R=∅. The process has found a solution.

It is straightforward to prove by contradiction that the process is complete, meaning that it will find a feasible acyclic subgraph if one exists. Suppose that the process fails: there is a feasible acyclic subgraph, but R≠∅ and the process concludes no solution exists. In the feasible acyclic subgraph, at least one node in R has no outgoing arcs in R×R, otherwise there are cycles in the graph. Therefore, this node can be opened by adding only arcs in R×S, where $S = S^0 \cup S^1 \cup \ldots \cup S^n$. Because all arcs in R×S in the process were added, this node should have opened in R, which is a contradiction. Therefore, considering collision constraints only, the peeling process will always find a solution if one exists. And when the process cannot find a solution, there is no feasible order to avoid collision.

Figure 25:
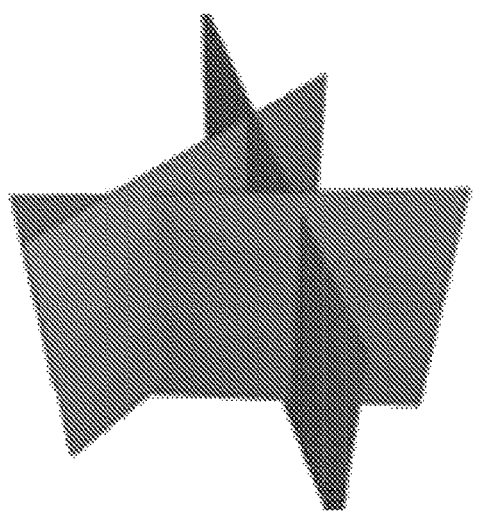
FIG. 25 depicts a model with three cyclically dependent top edges such that the edges cannot be printed in any order.

This proof also provides some insight into the problem. An infeasible set of nodes is one in which every node in the graph is closed initially, i.e., $S_0 = \emptyset$. That is, not a single edge can be printed in any orientation if interference with all the other edges is considered. The proof above shows that this is the only case where no collision free order exists if the support constraint is not considered (further described below). This usually happens when there are edges close to each other that form a cyclically dependent configuration (see the example in FIG. 25). In principle, this situation can be resolved by splitting the edges into smaller pieces and printing them separately to break the cyclic dependency.

Removing Redundant Constraints

The peeling process provides a partial order following which the edges can be sorted into a collision-free sequence. However, the goal of the peeling process is to find any feasible acyclic subgraph, and in the process it adds many redundant collision arcs that can cause unnecessary difficulty in ordering. It was found that many of these constraints can be removed. As long as any node in the graph is not closed, a feasible acyclic subgraph remains. So in order to have more freedom in the ordering phase, the redundant arcs are removed after the peeling process to find a set of constraints that is as small as possible.

Figure 28:
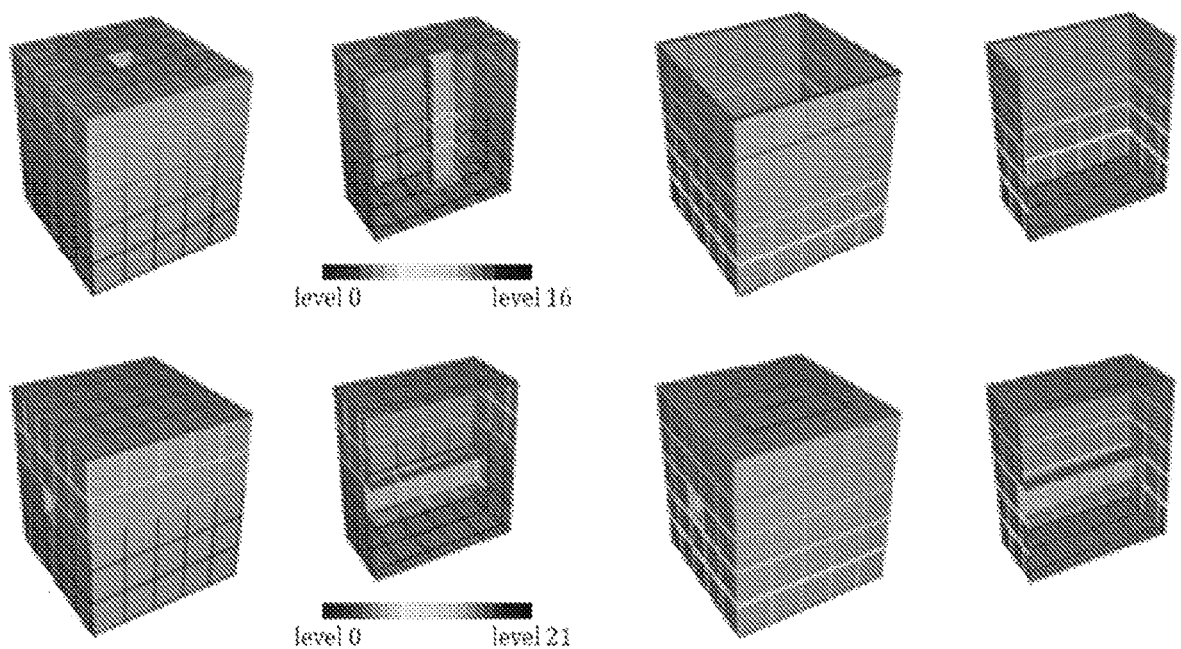
FIG. 28 depicts a cube with a hole on top, wherein the left two columns show the levels of the edges, and the right two columns show the printing order: in the top row, an ordering process becomes stuck because the collision constraints require the edges on the top face to be printed after the edges in the hole, but the edges cannot be printed without printing at least part of the top first; in the bottom row, a feasible printing plan can be found if the model is rotated by 90 degrees.

Each node in the graph is considered in the removal process. For each node, each outgoing arcs is considered in turn to determine whether or not removing the arc will close that node. If not, the arc is removed and associated orientations are closed. Then, the next arc is considered. The order in which the arcs are considered may affect the result because it affects which constraints remain, and an inappropriate remaining set of constraints may result in the failure to find a feasible solution (FIG. 28). The heuristic of removing arcs first that most conflict with a simple ordering heuristic is applied. In particular, arcs are considered and removed in the ascending order of the distance from the origin (the plane of the base) of the arc's ending node.

Returning to the example in FIG. 23, after peeling, three arcs are removed resulting in graph $G_3'$. Removing these arcs closes one orientation for each of a, b, and c, but creates more flexibility in ordering (e.g., e can be printed before b). The remaining arcs cannot be removed because removing them would close nodes.

Scheduling Mesh Edges

In addition to the support and collision constraints, it was observed that edge sequences with certain favorable properties tend to make the printing process robust and to improve print quality. In particular, the edges should connect back to printed parts as frequently as possible, and long, straight moves that connect several previously printed parts are favorable.

For convenience, the mesh is assumed to be a manifold, though the present technique can also be applied to non-manifold meshes with the exception of the refinement described below under the heading of "Smooth Contour." The presently-disclosed edge ordering process starts with the platform edges, denoted by $E_r$. Edges are repeatedly added to the printing sequence until the whole mesh is included. In each iteration, the printed edges of the faces that are not completed are found. These printed edges are referred to as the old contour $C_{old}$, and the vertices on $C_{old}$ are denoted by $V_0$. The set of vertices that are separated from $V_0$ by one unprinted edge is $V_1$. The set of unprinted edges that connect two vertices in $V_0$ is $E_0$; and those connecting two vertices in $V_1$ are $E_2$, which form the new contour $C_{new}$. The set of unprinted edges between $V_0$ and $V_1$ is $E_1$. After determining these sets (FIG. 26 top), the unconstrained edges $E_1 \subseteq E_1$ are printed first. Then, the unconstrained edges $E_2^* \subseteq E_2$ are printed.

---

Process 2

Print the platform edges $E_r$.
while not all nodes are printed do
    Find the vertex sets $V_0$ and $V_1$
    Find the unprinted edge sets $E_0$, $E_1$, and $E_2$
    Print unconstrained edges $E_0^* \subseteq E_0$

---

-continued

Process 2

Print unconstrained edges $E_1^* \subseteq E_1$
    Print unconstrained edges $E_2^* \subseteq E_2$
end while

---

Assuming that the input mesh is a single connected component, this process can traverse the whole mesh and terminate unless the collision constraints are not compatible with traversal. When there are unprinted edges, $E_0$ and $E_1$ cannot be both empty. So as long as $E_0^*$ and $E_1^*$ are not both empty, the process will always find new edges to print until all edges are printed.

Integrating Collision Constraints

Collision constraints may be considered in the ordering process such that the edge print schedule does not conflict with them. Let $\tilde{E}$ denote the set of unprinted edges. When an edge $e \in E_0$ is scheduled for print, the method may consider whether or not there is a collision arc path from $\tilde{E} \backslash E_0$ to e. If there is, then e should not be scheduled at the moment, and will wait for the next iteration, otherwise $e \in E_0^*$. Similarly, the method considers whether or not there is a collision arc path from $\tilde{E} \backslash (E_0^* \cup E_1)$ for $E_1$ edges and considers whether or not a collision arc path exists from $\tilde{E} \backslash (E_0^* \cup E_1^* \cup E_2)$ for $E_2$. Collision arcs between edges in the same-subscript E set do not affect what can be printed in the current iteration, because the same-subscript edges can be ordered according to these constraints. An extra supporting constraint may be considered for $E_2$ edges. Because only a subset of $E_1$ is printed, some edges in $E_2$ may be unsupported, which should be excluded from $E_2^*$.

It is possible for the ordering process to fail due to collision constraints. This only occurs if the collision constraints are incompatible with any traversal order of the mesh. To see this, note that the ordering process will only get stuck when every edge in $E_0 \cup E_1$ has collision paths from $\tilde{E} \backslash (E_0 \cup E_1)$. In such a case, the process will proceed until it reaches a state where every unprinted edge adjacent to the printed part has incident collision paths from the unprinted edges that are not adjacent to the printed part (FIG. 28). This defines a cut through the mesh that can never be crossed by any traversal order, since every edge on the cut can only be printed after the process has crossed the cut. Therefore, if the ordering process gets stuck, it means that the collision constraints force some unsupported edges to be printed, and there is no feasible solution to the ordering problem. This does not imply there is no solution to the full scheduling problem: the collision phase chooses some feasible acyclic subgraph, but it is possible that there exists a different such subgraph that would be traversal-compatible.

Smooth Contours

Figure 26A:
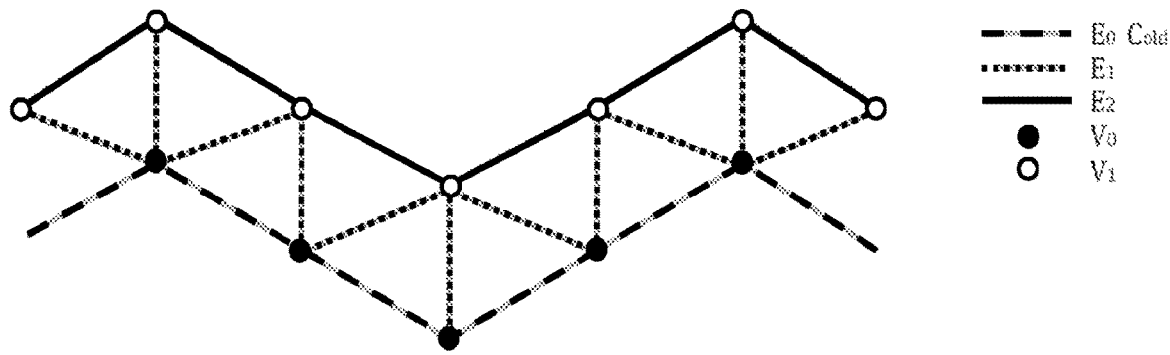
FIG. 26A is a graph showing the set of edges and vertices to be printed for an exemplary wireframe.
Figure 26B:
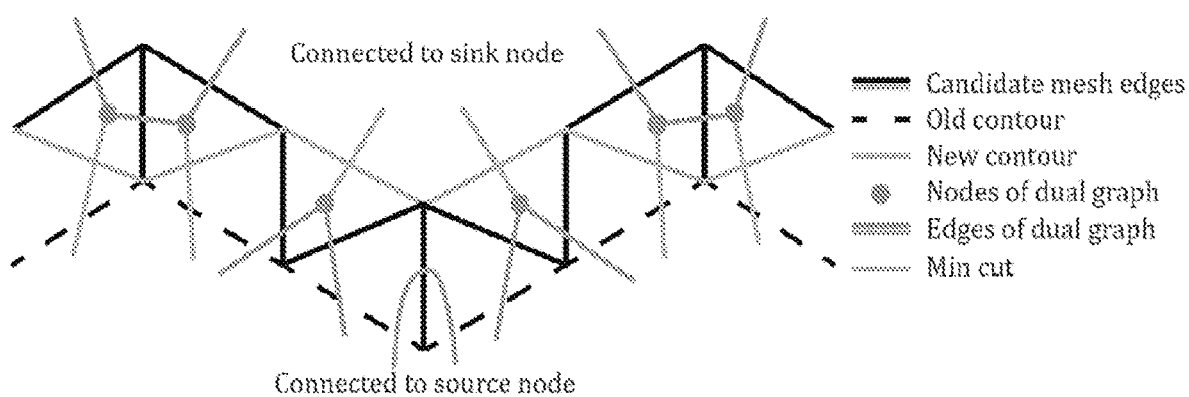
FIG. 26B is a graph corresponding to the graph of FIG. 26A and showing min cut on the dual graph corresponding to a minimum cost contour on the mesh (to force the contour to advance, the edges are not included on the old contour in the dual graph)

Smoother contours with fewer folds were found to provide better printing quality. As such, Process 2 may be refined to take special care when it advances the printed part. For example, the edges in $E_1 \cup E_2$ are taken as a candidate set and a subset is found to form a smooth new contour. With a smooth scalar field, for example, height, the cost of an edge was the difference of field values at its two vertices, by minimizing, a contour can be found that follows the isopleth of the field. It was observed that the minimum-cost contour on the mesh corresponds to the minimum cut on the dual graph (FIG. 26 bottom). The minimum cut on the dual graph was found and the corresponding edges were used as the new contour $C_{new}$. The set of vertices on $C_{new}$ and not on $C_{old}$ is $V_1'$. And the set of edges between $V_0$ and $V_1'$ is $E_1'$.

In each iteration, only the unconstrained edges in $E_1'$ are printed, and then those in $C_{new}$. A special case is presented when the adjacent edges of a vertex in $V_1$ are all in $E_1$ (e.g., the top of the right sphere in FIG. 27). In such a case, $E_2=\emptyset$ and there is no new contour. When such cases are detected, the unconstrained edges in $E_1$ may be printed directly.

This refined process may get stuck when the all $E_1'$ edges have incident collision arcs from $E_1 \backslash E_1'$. When this happens, the strategy of Process 2 may be used.

Figure 27:
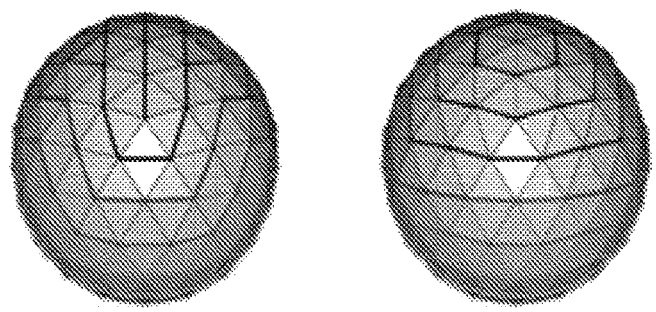
FIG. 27 depicts the contours on an icosphere found by the ordering process without (left) and with (right) the min cut strategy.

FIG. 27 shows a comparison of the contours on an icosphere found by this ordering process. With the min cut strategy, the contours are flattened by taking small advances at certain places.

Grouping Edges and Selecting Orientations

After determining the set of edges in $E_0^*$, $E_1^*$, and $E_2^*$, it may be advantageous to attempt to group the edges in each $E_i^*$ into continuous strips. For example, a greedy process may be used to find paths in each set which are as long as possible. Starting from an arbitrary edge, one of its unprinted adjacent edges in $E_i^*$ is added and this is repeated until no edge can be added. A heuristic may be used to prefer adding an edge that has unprinted adjacent edges in order to find long paths. Then, this grouping may be repeated to find other strips until all edges in $E_i^*$ are printed. Collision constraints may advantageously be considered here: if an edge has incoming collision arcs from unprinted edges when it is considered, it should not be added at that time.

Once the edges are ordered into strips, the printable orientations of every edge are updated based on the actual printing sequence. For example in FIG. 23, a decision may be made to print the edges in alphabet order. Only three arcs in the graph violate this order, so those arcs are removed, and the remaining are preserved in $G_4'$. Given this subgraph, all orientations of nodes a-d are open, and orientation 3 of e is also open since f is actually printed after e.

Then, each edge is assigned a printing orientation from among the feasible possibilities. In some embodiments, this is accomplished by building a graph with a node for every pair $(v,\omega)$ where v is an edge in the strip and $\omega$ is a feasible orientation for that edge. Every pair of nodes belonging to two edges adjacent in the printing schedule is connected by an edge in the graph, and labeled with a cost equal to the angle between the two orientations. A sequence of orientations having the minimum total rotation may be selected by finding a shortest path in this graph joining the first mesh edge to the last.

Exemplary Embodiments

Figure 29A:
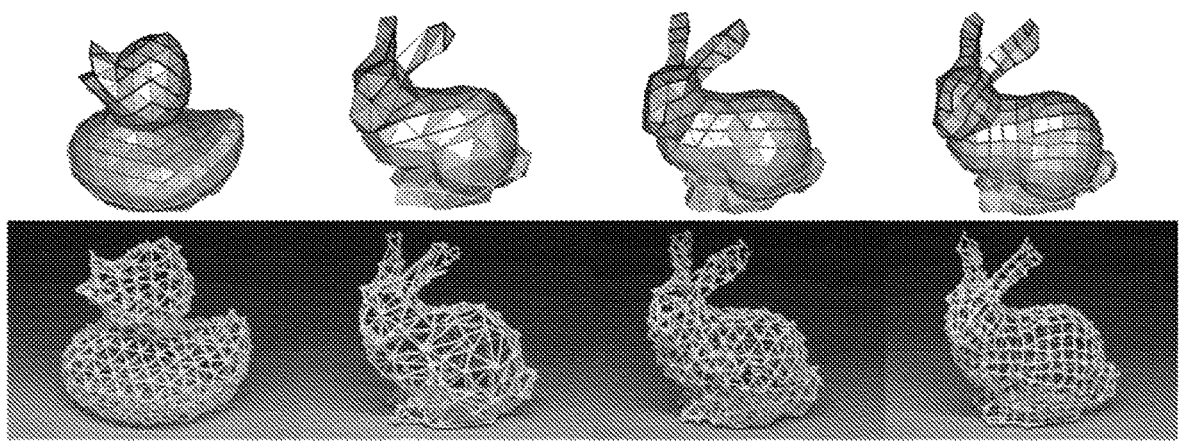
FIGS. 29A and 29B each show several digital models (top row of each figure) and the corresponding wireframes for each digital model printed using a 5DOF printer system according to an embodiment of the present disclosure (bottom row), and the depictions of the digital models show the order of the edges in which the contours are indicated by thicker lines, and order is indicated by gray scale (from white to black)
Figure 29B:
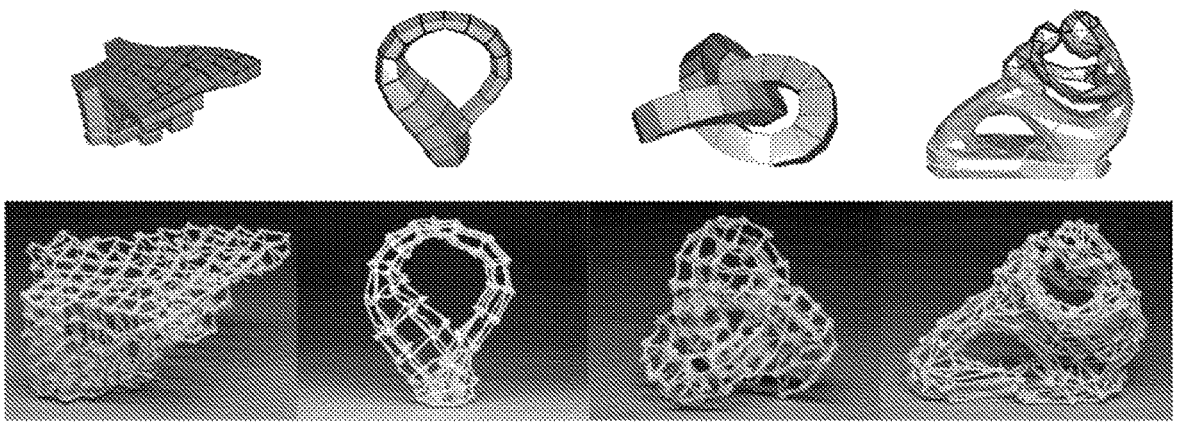

An embodiment of the present method was used to print a variety of meshes that could not be printed using previous wireframe printing methods. The results are shown in FIG. 29. The Klein bottle was meshed following its parameterization; the coarsest bunny and the fertility meshes were simplified from dense meshes using an edge-collapse method; and the other meshes were all created using Instant Field-aligned Meshes.

Three bunnies were printed with various meshing styles. In the simplified bunny, several edges on the ears were badly constrained by the neighbors (FIG. 21). The presently-disclosed method is able to find a collision-free plan for this mesh. Two other bunnies were printed with regular triangular and quadrilateral meshing, to show that the presently-disclosed method enables printing improved meshes for better surface depiction.

Figure 30:
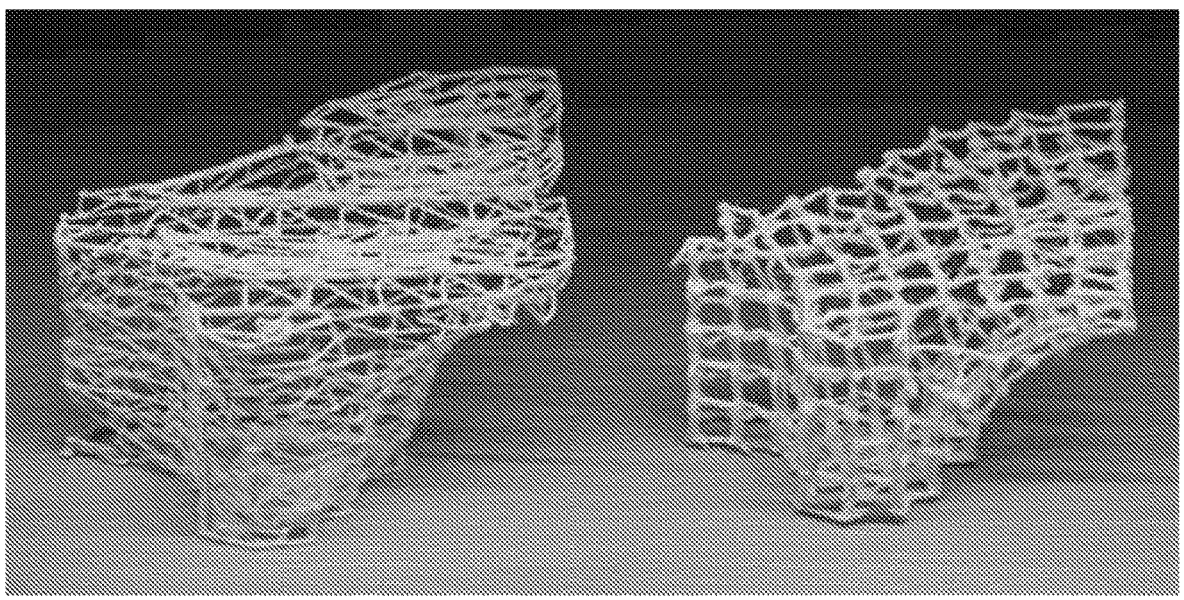
FIG. 30 depicts two wireframe prints of a fandisk model, where: the left wireframe was generated by Cura, which prints arbitrary surfaces but only wireframes printed by a system of a previous design; and the right wireframe shows a quadrilateral mesh printed using a method according to an embodiment of the present disclosure.

A quadrilateral fandisk mesh was printed using a test embodiment of the present disclosure and the result was compared against the result of a mesh using previous techniques (FIG. 30). The features of the shape are much better preserved in the quad mesh. In particular, it was noted that the previous technique had difficulty approximating the flat surface on the top.

The Klein bottle, trefoil knot, and fertility model show the ability of the presently-disclosed method to find collision-free printing plans for intersecting surfaces, complex shapes, and complex topologies. Furthermore, it was found that the time to compute the plans using the present method was much shorter than previous methods, and was dominated by collision sampling time, which depend on the number of sample points along each edge. The test embodiment generally used three samples per edge, which required up to 5 minutes on a modest laptop computer. The rest of the process completed in less than 20 seconds.

Failure cases: An example where the present process failed to find a traversal was a cube with a blind hole in the top face (FIG. 28). After the peeling and redundant arc removal steps, there remained collision arcs pointing from edges in the hole to edges on the top. The traversal process became stuck on the top because of these constraints. The root problem was that the path-length-based ordering heuristic used to select which collision arcs to keep was inappropriate for this example. The problem was solved, and a feasible plan was found, by rotating the model by 90 degrees so that the hole was on the side rather than on the top.

System for 3D Printing Arbitrary Meshes

In another aspect, the present disclosure may be embodied as a system 50 for 3D printing arbitrary meshes. The system 50 comprises a printhead 52 operable to deposit a filament 92 of a print medium. The print medium may be a plastic, for example, acrylonitrile butadiene styrene (ABS); glass; metal; or any other material or combination of materials suitable for creating a filament as will be apparent in light of the present disclosure. The system 50 includes a base 60 on which the print medium is deposited to fabricate an object 90. One or more actuators 62 are provided for moving the printhead 52 and/or the base 60 relative to one another. A processor 66 is in communication with the printhead 52 and the one or more actuators 62. The processor 66 is programmed to perform any of the methods described herein. For example, the processor 66 may be programmed to receive a model to be printed, the model comprising a plurality of edges; peel the model to generate a set of constraints for an edge print schedule that ensure collision-free printing orientations will exist for every edge; reduce the set of constraints by removing redundant constraints; generate the edge print schedule based on the reduced set of constraints; and operate the printhead 52 and the one or more actuators 62 to print the wireframe according to the edge print schedule.

Figure 33:
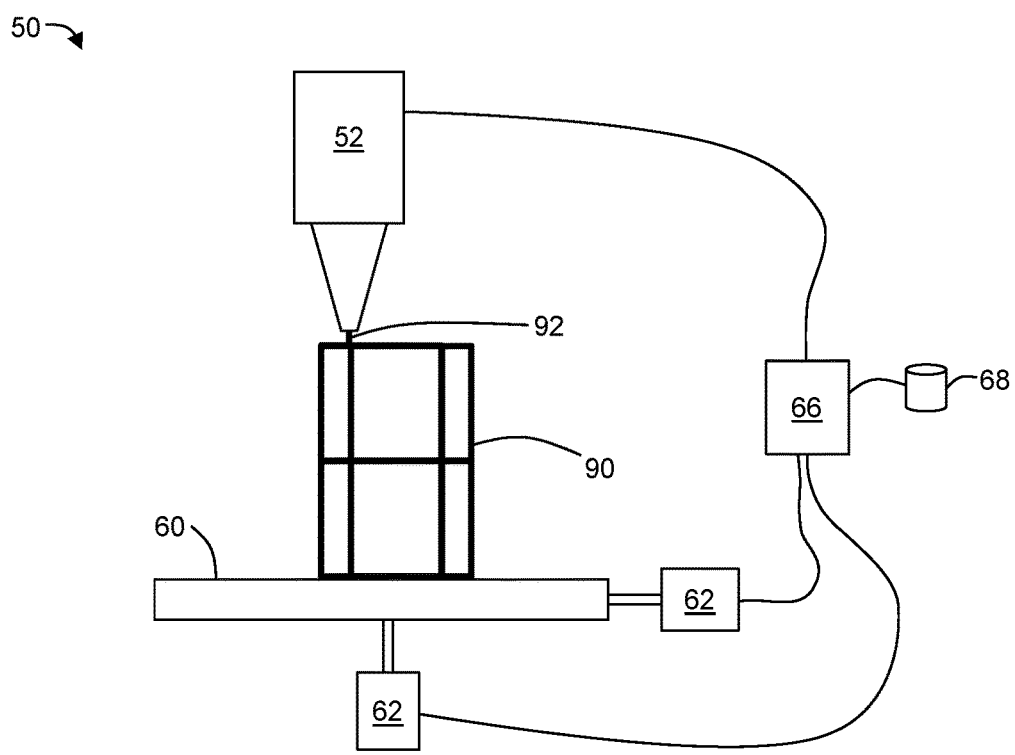
FIG. 33 is a diagram showing a system for printing arbitrary meshes according to another embodiment of the present disclosure.

Although described as a processor, it is to be appreciated that any processor described herein, including processor 66, may be implemented in practice by any combination of hardware, software, and firmware. Also, its functions as described herein may be performed by one unit, or divided up among different components, each of which may be implemented in turn by any combination of hardware, software, and firmware. Program code or instructions for a processor to implement the various methods and functions described herein may be stored in processor readable storage media, such as memory (e.g., a memory 18, 68 as illustrated in FIGS. 32 and 33).

While embodiments of the methods and systems for incremental printing and printing arbitrary meshes have generally been described separately herein for convenience, it should be noted that such systems and methods can be combined with each other. For example, the arbitrary mesh methods may be used in a system programmed to incrementally print wireframes while the user is designing the object to be printed. Either of the described systems and their embodiments can be used to perform any one of the methods disclosed herein.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A method for incrementally printing a 3D object as a set of wireframes, comprising: selecting, by a processor, a first primitive from a plurality of selectable primitives; generating, by the processor, a first wireframe of the first primitive; printing the first wireframe using a 3D printer; selecting, by a processor, a second primitive from the plurality of selectable primitives; determining, by a processor, if the second primitive contacts the first primitive; and generating, by the processor, a second wireframe of the second primitive if the second primitive contacts the first primitive; printing the second wireframe using the 3D printer, the second wireframe comprising a plurality of segments.

2. The method of claim 1, further comprising determining, by the processor, if the second primitive is complete, wherein the second primitive is determined to be complete if the second primitive has not been modified for a predetermined period of time.

3. The method of claim 1, further comprising:
determining, by the processor, if at least one segment of the generated second wireframe will contact the first wireframe of the first primitive;
defining a connecting patch of the first wireframe, such that the connecting patch will connect one or more segments of the generated second wireframe to the first wireframe; and
scheduling the connecting patch for printing on the 3D printer.

4. The method of claim 1, further comprising:
determining, by the processor, if the generated second wireframe includes an overhang;
defining a support component extending from the first wireframe to a bottom contour of the overhang; and
scheduling the support component for printing on the 3D printer.

5. The method of claim 1, further comprising:
determining, by the processor, if the generated second wireframe will extend beyond a periphery of a base;
defining a support component extending from a top portion of the base to a bottom contour of the generated second wireframe which extends beyond the periphery of the base; and
scheduling the support component for printing on the 3D printer.

6. The method of claim 1, further comprising:
determining, by the processor, if a subtractive primitive is complete;
defining a cutting tool path at the intersection of the completed subtractive primitive and a printed primitive; and
scheduling a cutting operation along the cutting tool path with a cutting tool of the 3D printer.

7. The method of claim 6, further comprising defining one or more healing segments along the cutting tool path and scheduling the one or more healing segments to be printed.

8. The method of claim 6, further comprising:
determining, by the processor, if the cutting tool path will intersect the first wireframe;
defining a sacrificial patch of the first wireframe, if the cutting tool will not intersect the first wireframe, wherein the sacrificial patch will intersect the cutting tool path;
scheduling the sacrificial patch for printing on the 3D printer.

9. The method of claim 1, further comprising:
adding the second wireframe to a queue of scheduled operations for the 3D printer;
calculating a set of possible sequences for the queue of scheduled operations and a number of conflicts for each sequence; and
ordering the scheduled operations according to a sequence selected from the set of possible sequences, the selected sequence having the lowest number of conflicts.

10. The method of claim 1, wherein printing the second wireframe comprises:
calculating a set of possible sequences for a queue of scheduled operations and a number of conflicts for each sequence; and
ordering the scheduled operations according to a sequence selected from the set of possible sequences, the selected sequence having the lowest number of conflicts.

11. A system for incremental 3D printing, the system comprising:
a printhead operable to deposit a filament of print medium;
a base on which the print medium is deposited; and
one or more actuators for moving the printhead and/or the base relative to one another; and
a processor in communication with the one or more actuators and the printhead, wherein the processor is programed to:
select a first primitive from a plurality of selectable primitives;
generate a first wireframe of the first primitive;
operate the printhead and the one or more actuators to print the first wireframe;
select a second primitive from the plurality of selectable primitives;
determine whether the second primitive contacts the first primitive;
generate a second wireframe of the second primitive if the second primitive contacts the first primitive; and
operate the printhead and the one or more actuators to print the second wireframe of the primitive.

12. The system of claim 11, wherein the relative movement between the printhead and the base comprises at least five degrees-of-freedom.

13. The system of claim 12, wherein the degrees-of-freedom include translation and rotation.

14. The system of claim 11, wherein the printhead further comprises a cutting tool and the processor is further programmed to:
determine if a subtractive primitive is complete;
define a cutting tool path at the intersection of the completed subtractive primitive and a printed primitive; and
move the cutting tool along the defined cutting tool path.

15. The system of claim 14, wherein the cutting tool is a heated blade.

16. The system of claim 11, wherein the base is removable and the processor is programmed to pause printing operations for removal of the base.

17. The system of claim 16, wherein the base comprises one or more alignment components for aligning the base during reinstallation.

18. The system of claim 17, wherein the one or more alignment components are magnets, pins, tabs, and/or notches.

19. The system of claim 11, further comprising a cooling device for cooling deposited print medium.

20. The system of claim 19, wherein the cooling device is a mist head for cooling deposited print medium.

\* \* \* \* \*